(12) United States Patent
Alptekin et al.

(10) Patent No.: US 10,326,000 B2
(45) Date of Patent: Jun. 18, 2019

(54) FINFET WITH REDUCED PARASITIC CAPACITANCE

(71) Applicant: International Business Machines Corporation, Armonk, NY (US)

(72) Inventors: Emre Alptekin, Wappingers Falls, NY (US); Veeraraghavan S. Basker, Schenectady, NY (US); Sivananda K. Kanakasabapathy, Pleasanton, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/878,452

(22) Filed: Jan. 24, 2018

(65) Prior Publication Data
US 2018/0151686 A1    May 31, 2018

Related U.S. Application Data

(60) Division of application No. 15/854,052, filed on Dec. 26, 2017, which is a continuation of application No.
(Continued)

(51) Int. Cl.
*H01L 29/06* (2006.01)
*H01L 29/66* (2006.01)
(Continued)

(52) U.S. Cl.
CPC ...... *H01L 29/665* (2013.01); *H01L 21/76895* (2013.01); *H01L 23/535* (2013.01);
(Continued)

(58) Field of Classification Search
None
See application file for complete search history.

(56) References Cited

U.S. PATENT DOCUMENTS 7,875,913 B2   1/2011 Rhodes
8,507,375 B1   8/2013 Labonte et al.
(Continued)

OTHER PUBLICATIONS

Clevenger, et al., "Contacts Having a Geometry to Reduce Resistance", U.S. Appl. No. 15/069,439, filed Mar. 14, 2016, 34 pages
(Continued)

*Primary Examiner* — Whitney Moore
(74) *Attorney, Agent, or Firm* — L. Jeffrey Kelly

(57) ABSTRACT

A method of fabricating a finFET semiconductor device, the method including forming a self-aligned silicide contact above and in direct contact with exposed portions of semiconductor fins not covered by a gate electrode, wherein an upper surface of the self-aligned silicide contact is substantially flush with an upper surface of an adjacent isolation region, patterning a blanket metal layer to form a source-drain contact on the upper surface of the self-aligned silicide contact, the self-aligned silicide contact provides an electrical path from the semiconductor fins to the source-drain contact, and recessing a portion of the self-aligned silicide contact without recessing the isolation region, the self-aligned silicide contact is recessed selective to a mask used to pattern the source-drain contact.

18 Claims, 24 Drawing Sheets

Related U.S. Application Data

15/333,262, filed on Oct. 25, 2016, now Pat. No. 9,985,109.

(51) Int. Cl.
  *H01L 29/78* (2006.01)
  *H01L 21/768* (2006.01)
  *H01L 23/535* (2006.01)
  *H01L 29/417* (2006.01)

(52) U.S. Cl.
  CPC .... *H01L 29/0649* (2013.01); *H01L 29/41791* (2013.01); *H01L 29/66545* (2013.01); *H01L 29/66553* (2013.01); *H01L 29/66795* (2013.01); *H01L 29/785* (2013.01)

(56) References Cited

U.S. PATENT DOCUMENTS

| | | |
|---|---|---|
| 8,564,030 B2 | 10/2013 | Schultz |
| 8,637,384 B2 | 1/2014 | Ando et al. |
| 8,878,311 B2 | 11/2014 | Cheng et al. |
| 8,890,261 B2 | 11/2014 | Chang et al. |
| 9,130,023 B2 | 9/2015 | Yamasaki |
| 9,443,738 B2 | 9/2016 | Zang et al. |
| 9,716,158 B1 | 7/2017 | Cheng et al. |
| 2008/0079090 A1 | 4/2008 | Hwang et al. |
| 2012/0007051 A1* | 1/2012 | Bangsaruntip ......... B82Y 10/00 257/24 |
| 2013/0187171 A1 | 7/2013 | Guillorn et al. |
| 2014/0077305 A1 | 3/2014 | Pethe et al. |
| 2014/0306291 A1* | 10/2014 | Alptekin ........... H01L 29/41725 257/369 |
| 2015/0060960 A1 | 3/2015 | Xie et al. |
| 2015/0129988 A1 | 5/2015 | Leobandung |
| 2015/0270176 A1 | 9/2015 | Xie et al. |
| 2016/0365424 A1 | 12/2016 | Basker et al. |

OTHER PUBLICATIONS

IBM, "Trench Silicide contacts", An IP.com Prior Art Database Technical Disclosure, Original Publication Date: Jul. 1, 2009, IP.com No. 000184829, IP.com Electronic Publication: Jul. 1, 2009, 2 pages.

Alptekin, et al., "Finfet With Reduced Parasitic Capacitence", U.S. Appl. No. 15/333,262, filed Oct. 25, 2016.

Pending U.S. Appl. No. 15/854,052, filed Dec. 26, 2017, entitled: "Finfet With Reduced Parasitic Capacitence", 47 pages.

IBM: List of IBM Patents or Patent Applications Treated as Related (Appendix P), Jan. 26, 2018, 2 pages.

\* cited by examiner

FINFET WITH REDUCED PARASITIC CAPACITANCE

The present disclosure generally relates to integrated circuits, and more particularly to fabricating semiconductor devices having self-aligned contacts with reduced parasitic capacitance between the gate and the source drain contact(s).

Contacts are formed in order to make electrical connections to a semiconductor device. Contacts to a source region or a drain region of the semiconductor device may be generally referred to as CA contacts. CA contacts may be distinguished from CG contacts which typically form an electrical connection to the gate conductor of a semiconductor device. The source and drain regions must remain electrically insulated from the gate terminal in order to maintain functionality of the semiconductor device.

SUMMARY

According to one embodiment of the present disclosure, a method of fabricating a finFET semiconductor device is provided. The method of fabricating a finFET semiconductor device includes forming a self-aligned silicide contact above and in direct contact with exposed portions of semiconductor fins not covered by a gate electrode, wherein an upper surface of the self-aligned silicide contact is substantially flush with an upper surface of an adjacent isolation region, patterning a blanket metal layer to form a source-drain contact on the upper surface of the self-aligned silicide contact, the self-aligned silicide contact provides an electrical path from the semiconductor fins to the source-drain contact, and recessing a portion of the self-aligned silicide contact without recessing the isolation region, the self-aligned silicide contact is recessed selective to a mask used to pattern the source-drain contact.

According another exemplary embodiment, a method of fabricating a finFET semiconductor device is provided. The method of fabricating a finFET semiconductor device includes forming a dummy gate above and perpendicular to semiconductor fins, forming sidewall spacers on opposite sides of the dummy gate, and covering exposed portions of the semiconductor fins not covered by the dummy gate or the sidewall spacers with a dummy dielectric material. The method further includes forming an isolation region adjacent to and in direct contact with the dummy dielectric material, an upper surface of the isolation region is substantially flush with an upper surface of the dummy dielectric material, replacing the dummy gate with a metal gate electrode covered by a dielectric gate cap, and replacing the dummy dielectric material with a self-aligned silicide contact, the self-aligned silicide contact being adjacent to and in direct contact with the sidewall spacers which separates it from the metal gate electrode, wherein the dummy dielectric material is removed selective to the isolation region, the sidewall spacers, and the dielectric gate cap. The method further includes forming a blanket metal layer on top of both the metal gate electrode and the self-aligned silicide contact, the blanket metal layer being in direct contact with the self-aligned silicide contact but physically isolated from the metal gate electrode by the dielectric gate cap, using a mask to pattern the blanket metal layer and form a source-drain contact, and recessing a portion of the self-aligned silicide contact not covered by the source-drain contact using the mask.

According another exemplary embodiment, a finFET semiconductor device is provided. The finFET semiconductor device includes a plurality of fins etched from a semiconductor substrate, a gate electrode above and perpendicular to the plurality of fins, each comprising a pair of spacers on opposing sides of the gate electrode, a self-aligned silicide contact positioned above and between active fin regions, wherein the self-aligned silicide contact has a stepped profile comprising at least a first upper surface and a second upper surface, the first upper surface being above the second upper surface, and a metal contact above and in direct contact with only the first upper surface of the self-aligned silicide contact, the self-aligned silicide contact provides an electrical path from the metal contact to the active fin regions.

BRIEF DESCRIPTION OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
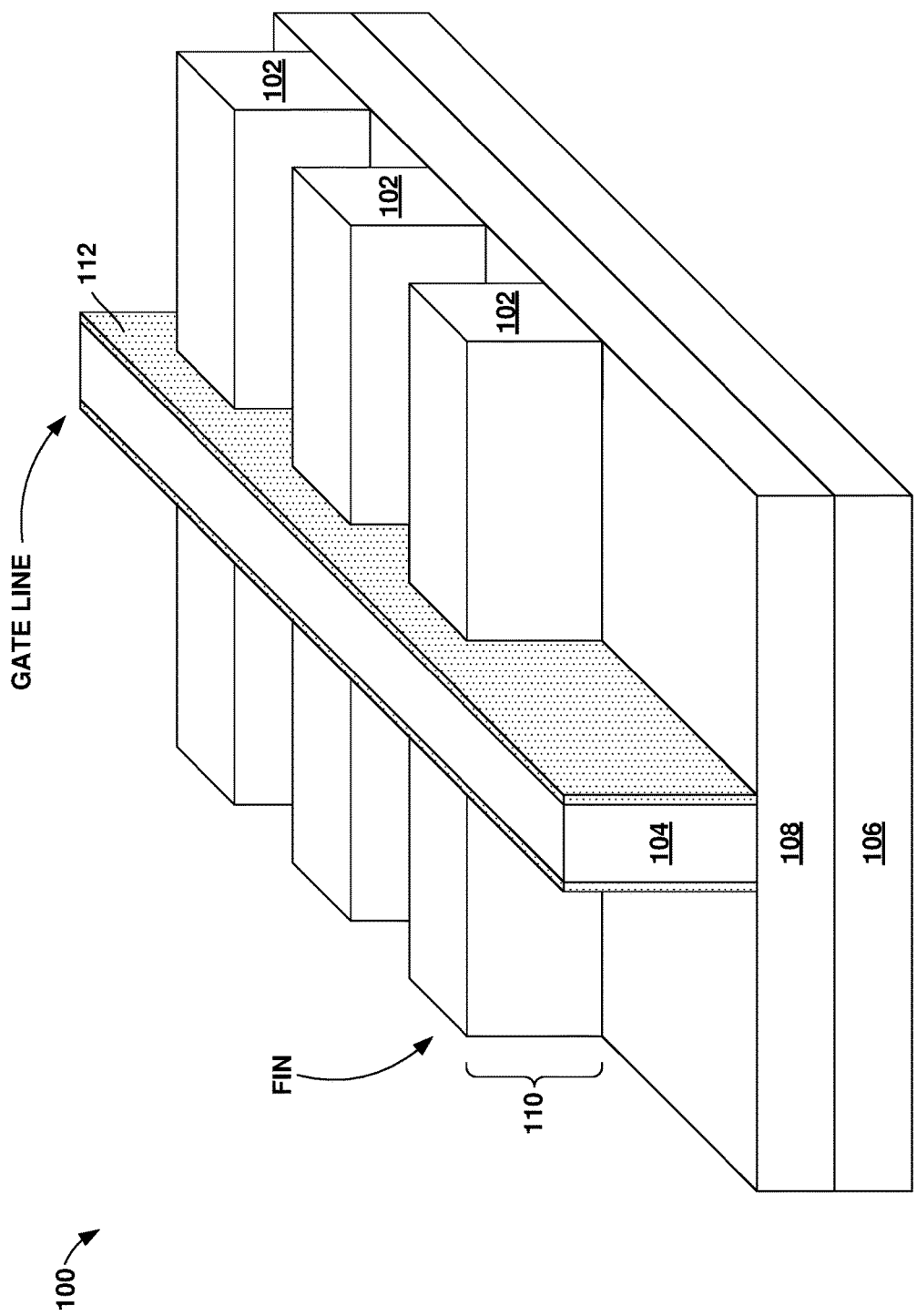
FIG. 1 is an isometric view of a finFET semiconductor device during an intermediate step of a method of fabricating a self-aligned contact with reduced contact-to-gate capacitance according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As semiconductor devices shrink in each generation of semiconductor technology, close proximity between the source-drain stud (CA) contact and the gate results in an increased parasitic capacitance between the two. This increase in capacitance is of particular importance in devices with fully strapped active areas or otherwise referred to as merged source-drain regions. In such devices, the CA contact merges and electrically connects multiple active areas, or in the case of a finFET device, multiple fins. As such, a fully strapped contact may typically run an entire length of the merged source-drain regions, thereby further increasing the capacitance between the gate and the CA contact. Ultimately, increased capacitance between the gate and the CA contact negatively affects device performance. Therefore, reducing the capacitance between the gate and the CA contact will not only improve device performance, when necessary, but also offer some design flexibility to increase device performance.

Self-aligned contacts of advanced technologies may be typically formed between two adjacent semiconductor devices, for example, between two adjacent gate lines. Generally, self-aligned contacts are particularly beneficial when the spacing between the two adjacent semiconductor devices is less than the current ground rule limitations. It should be noted, for purposes clarity and understanding, only a single semiconductor device is illustrated in the figures associated with the following description; however, one skilled in the art will appreciate the present disclosure as is it relates to multiple devices.

The present disclosure generally relates to integrated circuits, and more particularly to fabricating semiconductor devices having self-aligned contacts with reduced capacitance between the gate and the fully strapped source drain contact(s). Ideally, reducing contact-to-gate capacitance will improve device performance by reducing parasitic capacitance between the gate and the contact. One way to reduce parasitic capacitance between the gate and the fully strapped contact may include recessing a portion of the strapped contact to remove excess conductive material. Removing excess conductive material from the strapped contact will reduce the surface area of the conductive material opposing the gate, thereby reducing the parasitic capacitance between the gate and the contact. One embodiment by which to fabricate the self-aligned contacts with reduced contact-to-gate capacitance is described in detail below by referring to the accompanying drawings FIGS. 1-25. In the present embodiment, the self-aligned contacts may be formed directly above the fins, or active regions, of a finFET device.

A finFET device may include a plurality or array of fins formed in a wafer; one or more gates covering a portion of the fins, where the portion of the fins covered by the gate(s) serves as a channel region of the device and portions of the fins extending out from under the gate(s) serve as source and drain regions of the device; and a pair of device spacers on opposite sides of the gate. It should be noted that the invention disclosed below may be fabricated using either a replacement gate or gate last process flow, or a gate first process flow; however, the following description relies on a gate last process flow.

Figure 2:
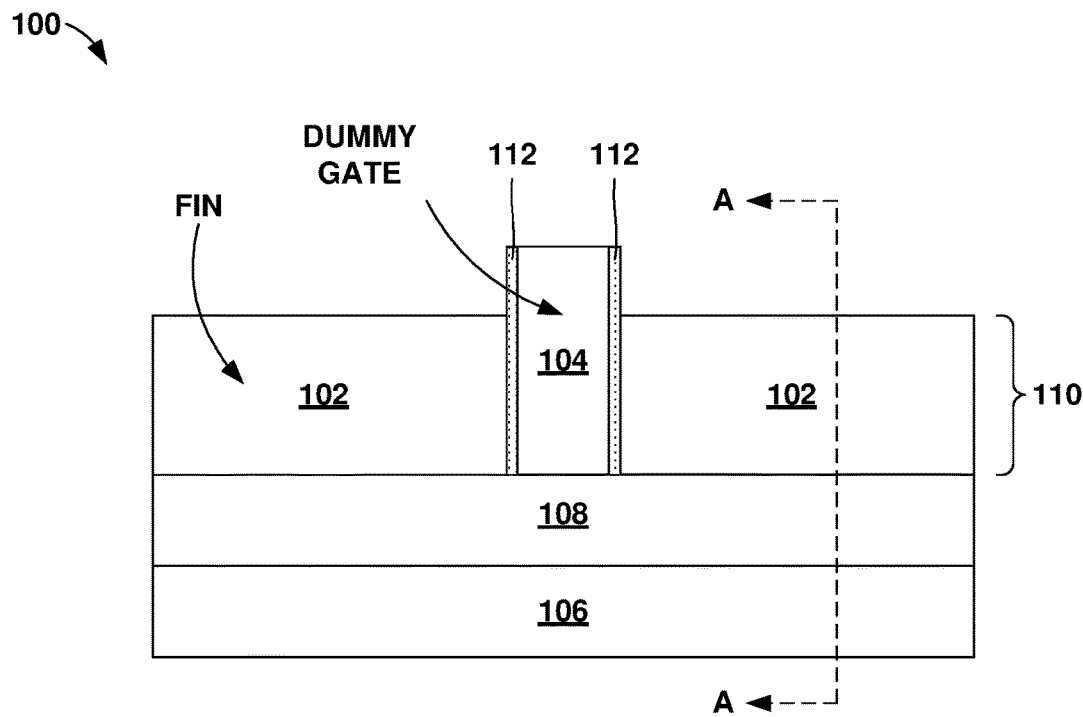
FIG. 2 is a cross section view of FIG. 3, taken along section line B-B according to an exemplary embodiment.
Figure 3:
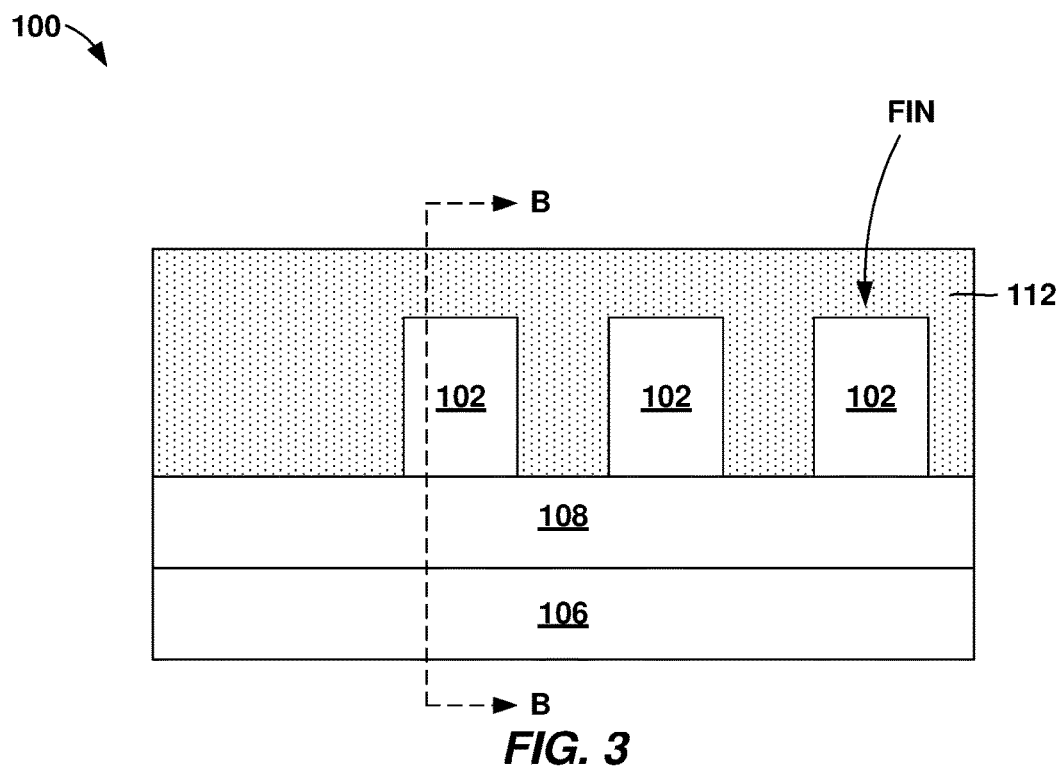
FIG. 3 is a cross section view of FIG. 2, taken along section line A-A according to an exemplary embodiment.

Referring now to FIGS. 1, 2, and 3 a structure 100 is shown during an intermediate step of a method of fabricating a self-aligned contact with reduced contact-to-gate capacitance according to an embodiment of the invention. FIG. 1 is an isometric view of the structure 100. FIG. 2 is a cross section view of FIG. 3 taken along section line B-B, and perpendicular to an array of fins 102 (hereinafter "fins"). FIG. 3 is a cross section view of FIG. 2 taken along section line A-A, and parallel to the fins 102. As previously mentioned, and for purposes clarity and understanding, only a single semiconductor device is illustrated and described below. It should also be noted that while this description refers to some components of the structure 100 in the singular tense, more than one component may be depicted throughout the figures and like components are labeled with like numerals.

At this step of fabrication the structure 100 may be generally complete with a dummy gate f formed over a center portion of the fins 102. It should be noted that the fins 102 may be formed in or above any semiconductor substrate know to a person having ordinary skill in the art, including but not limited to silicon-on-insulator (SOI) substrates and bulk silicon substrates. For example, the SOI substrate illustrated and described below may generally include a base substrate 106, a buried dielectric layer 108 (e.g., buried oxide) formed on top of the base substrate 106, and an SOI layer 110 formed on top of the buried dielectric layer 108, according to known techniques.

The fins 102 are etched from the SOI substrate, specifically the SOI layer 110, using typical photolithography techniques, such as, for example, known sidewall image transfer techniques. The fins 102 may be primarily formed from the SOI layer 110 of the SOI substrate; however, in some embodiments the fins 102 may include multiple layers in addition to the SOI layer 110. For example, an oxide layer (not shown) and a nitride layer (not shown) may be formed on a top surface of the SOI layer 110 to aid in patterning the fins 102.

The dummy gate 104 may include any suitable oxide, for example, a silicon oxide or a silicon oxynitride. In a preferred embodiment, the dummy gate 104 may include any material that which may be removed selective to the subsequently formed sidewall spacers and preferably selective to any subsequently formed isolation regions and other dummy dielectric materials subsequently deposited to cover and protect active regions of the fins 102. The dummy gate 104 can be deposited using any suitable conformal deposition technique known in the art. In one embodiment, the dummy gate 104 may include silicon dioxide ($SiO_2$) deposited using a chemical vapor deposition technique.

Next, sidewall spacers 112 may be formed by conformally depositing or growing a dielectric material, followed by an anisotropic etch that removes the dielectric from the horizontal surfaces of the structure 100 while leaving it on the sidewalls of the dummy gate 104. In an embodiment, the sidewall spacers 112 may include any suitable dielectric. In an embodiment, the sidewall spacers 112 may include silicon nitride. In an embodiment, the sidewall spacers 112 may have a horizontal width, or thickness, ranging from about 3 nm to about 30 nm, with 10 nm being most typical. Typically, the sidewall spacers 112 may include a single layer; however, they may include multiple layers of dielectric material. It may be noted that the sidewall spacers 112 may generally insulate the gate regions from the source-drain regions, for example, electrically insulate the subsequently formed gate electrode from surrounding structures, for example, subsequently formed contacts.

Figure 4:
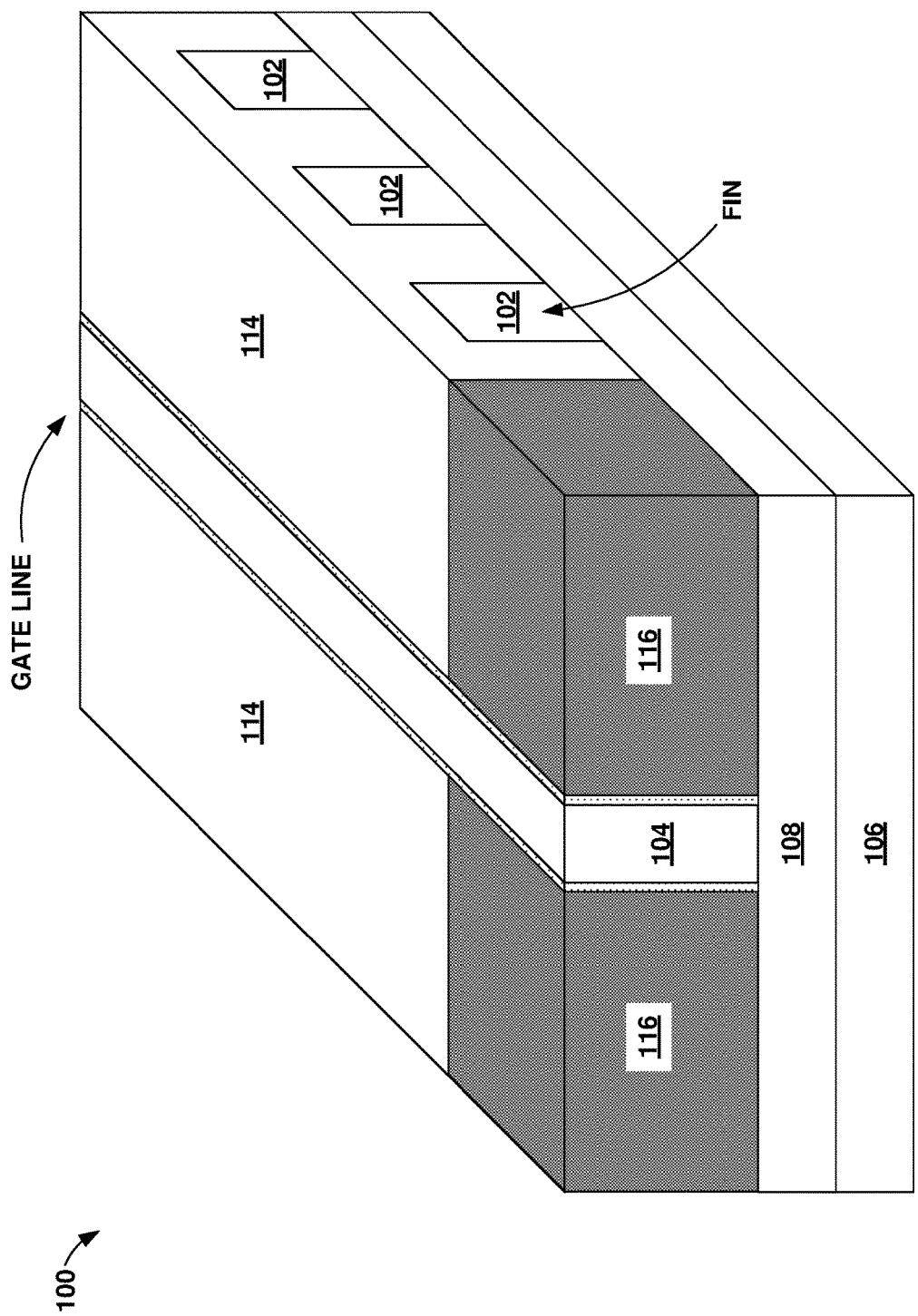
FIG. 4 is an isometric view of the finFET semiconductor device after forming an isolation region and covering active regions with a dummy dielectric material according to an exemplary embodiment.
Figure 5:
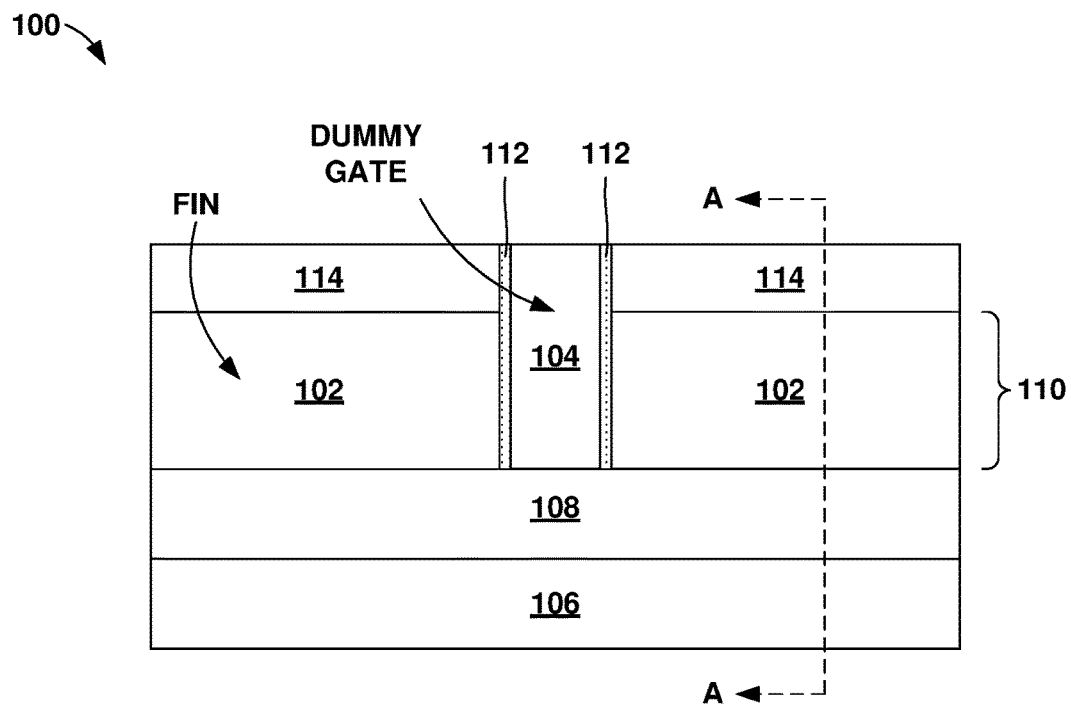
FIG. 5 is a cross section view of FIG. 6, taken along section line B-B according to an exemplary embodiment.
Figure 6:
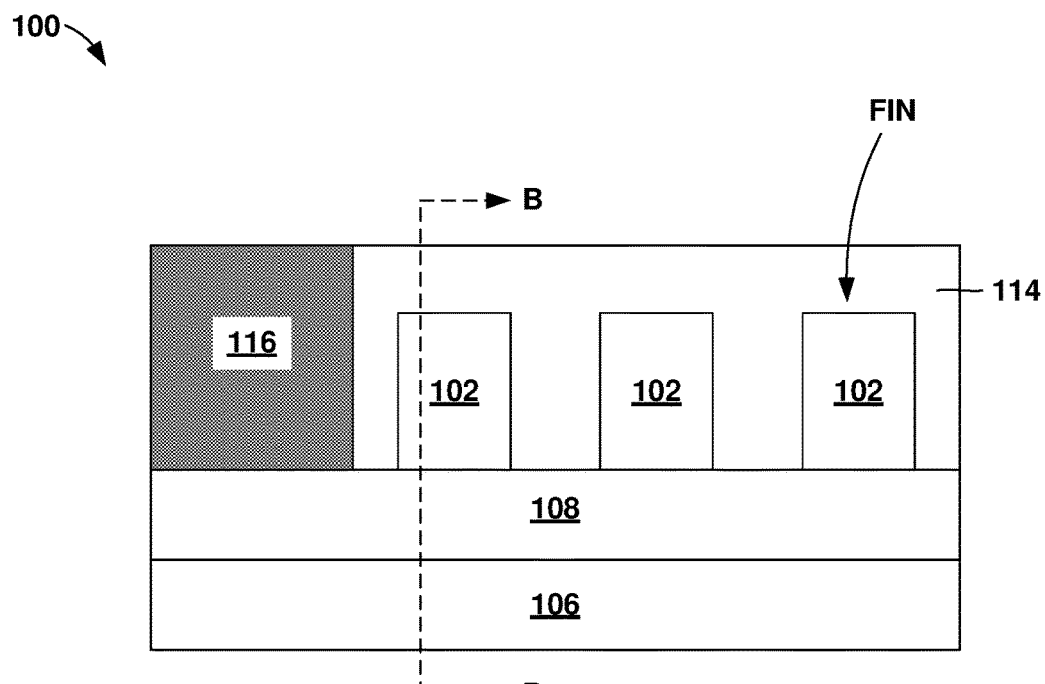
FIG. 6 is a cross section view of FIG. 5, taken along section line A-A according to an exemplary embodiment.

Referring now to FIGS. 4, 5, and 6, the structure 100 is shown after covering the exposed active regions of the fins 102 with a dummy dielectric 114 and forming an isolation region 116 in accordance with an embodiment of the present invention. Like above, FIG. 4 is an isometric view of the structure 100; FIG. 5 is a cross section view of FIG. 6 taken along section line B-B, and perpendicular to the fins 102; and FIG. 6 is a cross section view of FIG. 5 taken along section line A-A, and parallel to the fins 102.

The dummy dielectric 114 may include one or more insulator films, such as, for example, a thin nitride (<5 nm) at the bottom followed by an oxide fill above. Alternatively, the dummy dielectric 114 may include a thin nitride (<5 nm) at the bottom followed by a polysilicon fill above. In yet another embodiment, the dummy dielectric 114 may include a thin oxide (<5 nm) at the bottom followed by a nitride fill above. Finally, the dummy dielectric 114 may include any combination of nitride oxide and polysilicon that which is selectively removable during subsequent processing steps.

The isolation region 116 is preferably made from different dielectric materials than those of the dummy dielectric 114. Specifically, the chosen material(s) should allow for the dummy dielectric 114 to be removable selective to the isolation region 116, and selective to sidewall spacers 112. Therefore, the dummy dielectric 114 can be selectively removed and replaced with a contact metal in later step. For example, the isolation region 116 may include a nitride, a silicon carbon nitride, or other suitable material(s). In addition, the isolation region 116 and the dummy dielectric 114 may be formed in any order; however, the dummy dielectric 114 is typically deposited and patterned first to limit any overetch of the active regions of the fins 102.

Figure 7:
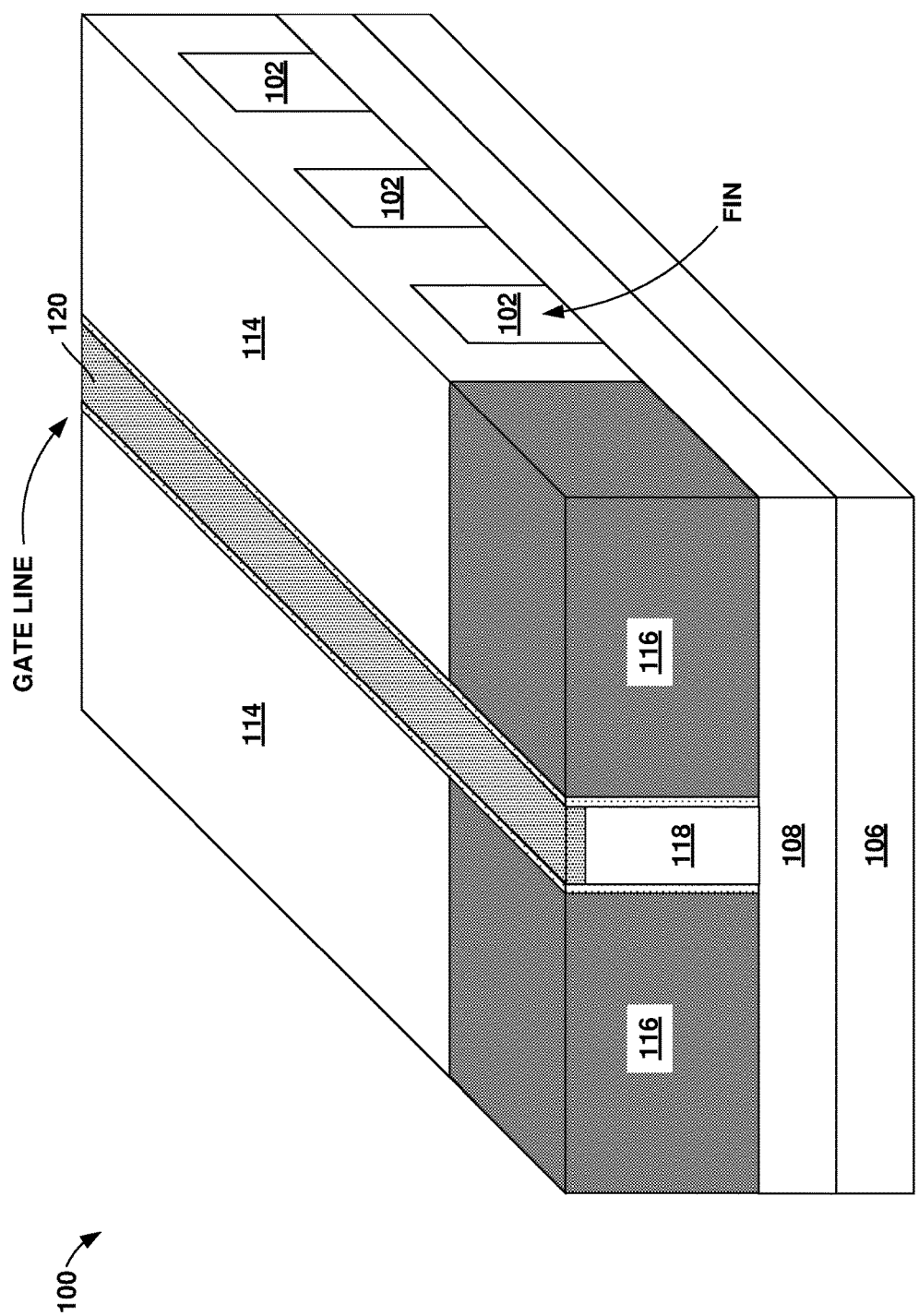
FIG. 7 is an isometric view of the finFET semiconductor device after forming a replacing the dummy gate with a metal gate electrode and gate cap according to an exemplary embodiment.
Figure 8:
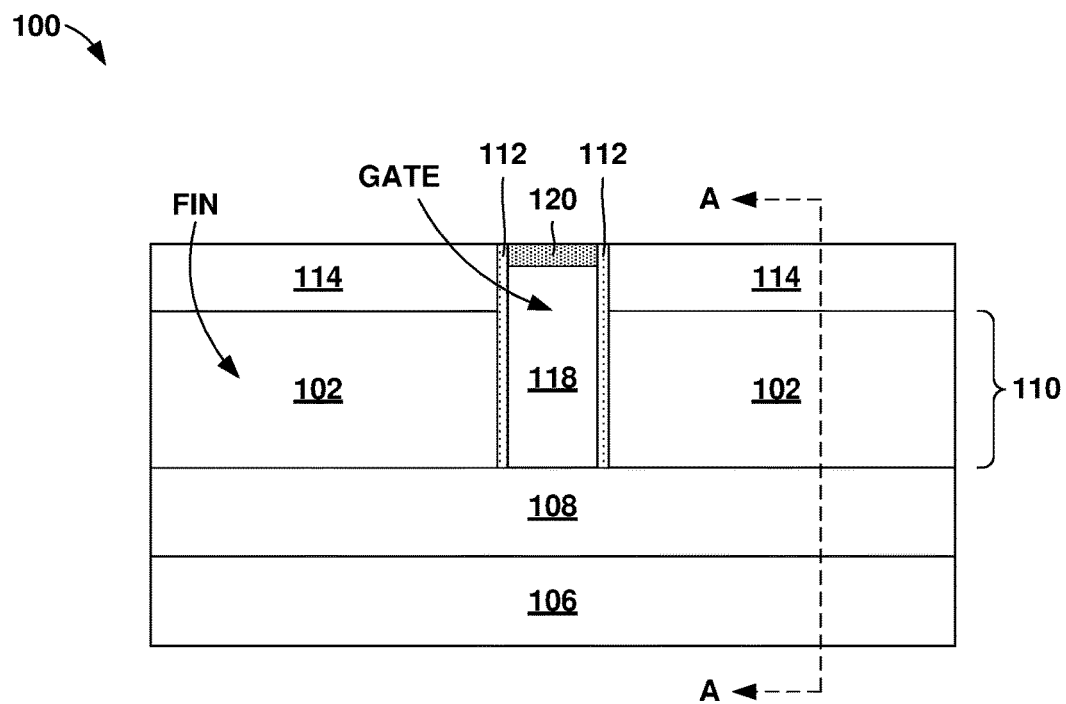
FIG. 8 is a cross section view of FIG. 9, taken along section line B-B according to an exemplary embodiment.
Figure 9:
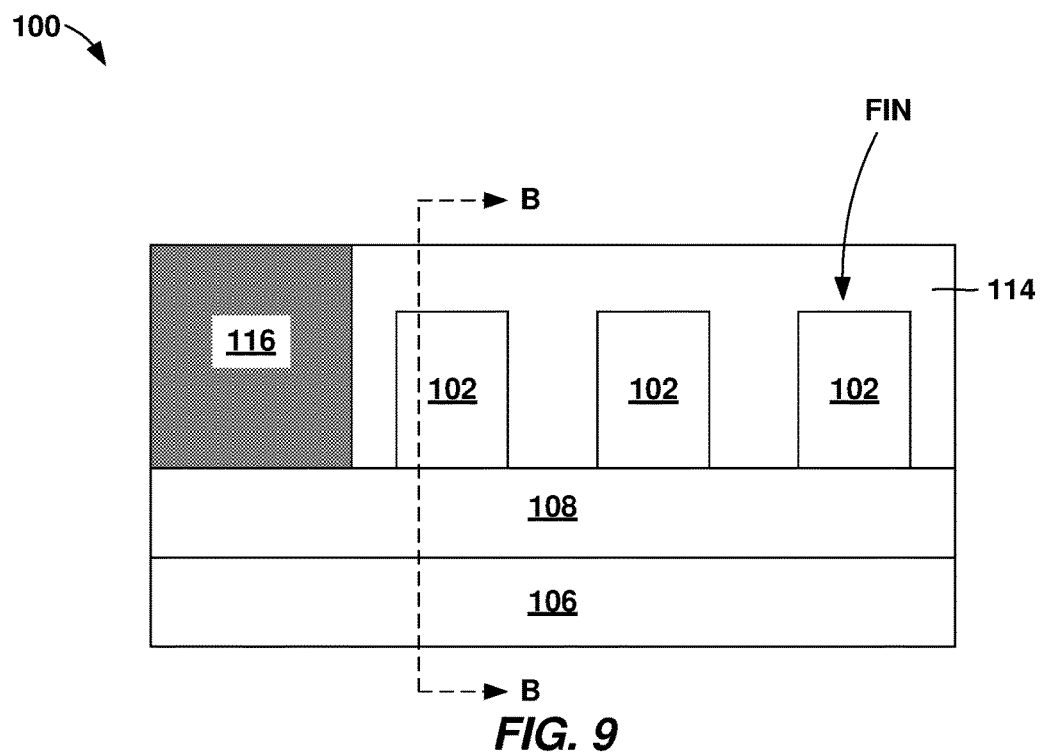
FIG. 9 is a cross section view of FIG. 8, taken along section line A-A according to an exemplary embodiment.

Referring now to FIGS. 7, 8, and 9, the structure 100 is shown after replacing the dummy gate 104 with a metal gate electrode 118 and a gate cap 120 in accordance with an embodiment of the present invention. Like above, FIG. 7 is an isometric view of the structure 100; FIG. 8 is a cross section view of FIG. 9 taken along section line B-B, and perpendicular to the fins 102; and FIG. 9 is a cross section view of FIG. 8 taken along section line A-A, and parallel to the fins 102.

Typical replacement gate fabrication techniques well known in the art may be used to remove the dummy gate 104 and form the gate electrode 118. The dummy gate 104 may be removed selective to the sidewall spacers 112 and the fins 102. For example, the selective removal of the dummy gate 104 may be accomplished by using any known etching technique suitable to remove silicon oxide (104) selective to silicon nitride (112), and silicon (102). In one embodiment, for example, the dummy gate 104 may be removed using a dry etching technique, for example reactive ion etching.

Next, the gate electrode 118 is deposited and substantially fills the space created between the sidewall spacers 112. The gate electrode 118 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In an embodiment, the gate electrode 118 may include one or more work function metals such as TiN, TaN, or TiC, to achieve the desired device threshold voltage and one or more low resistance metal such as W, Al, or Co. In an embodiment, the gate electrode 118 may include primarily tungsten.

Lastly, as mentioned above, the gate electrode 118 may further include an optional gate dielectric (not shown) configured below each gate separating them from the channel region of each fin 102. In gate first process flows, the gate dielectric may typically only be found between a bottom surface of the gate and the underlying substrate; however, in a replacement gate process flow, as described herein, the gate dielectric may typically separate the gate from both the underlying substrate, for example the fins 102, and the sidewall spacers 112.

The gate electrode 118 may then be covered by a gate cap 120 according to known techniques. The gate cap 120 may include any known hardmask material, such as, for example, TiN, W, Ti, Al, Ta, TaN, Co, and Ni. The gate cap 120 may, in some cases, be made from the same dielectric as the sidewall spacers 112.

Figure 10:
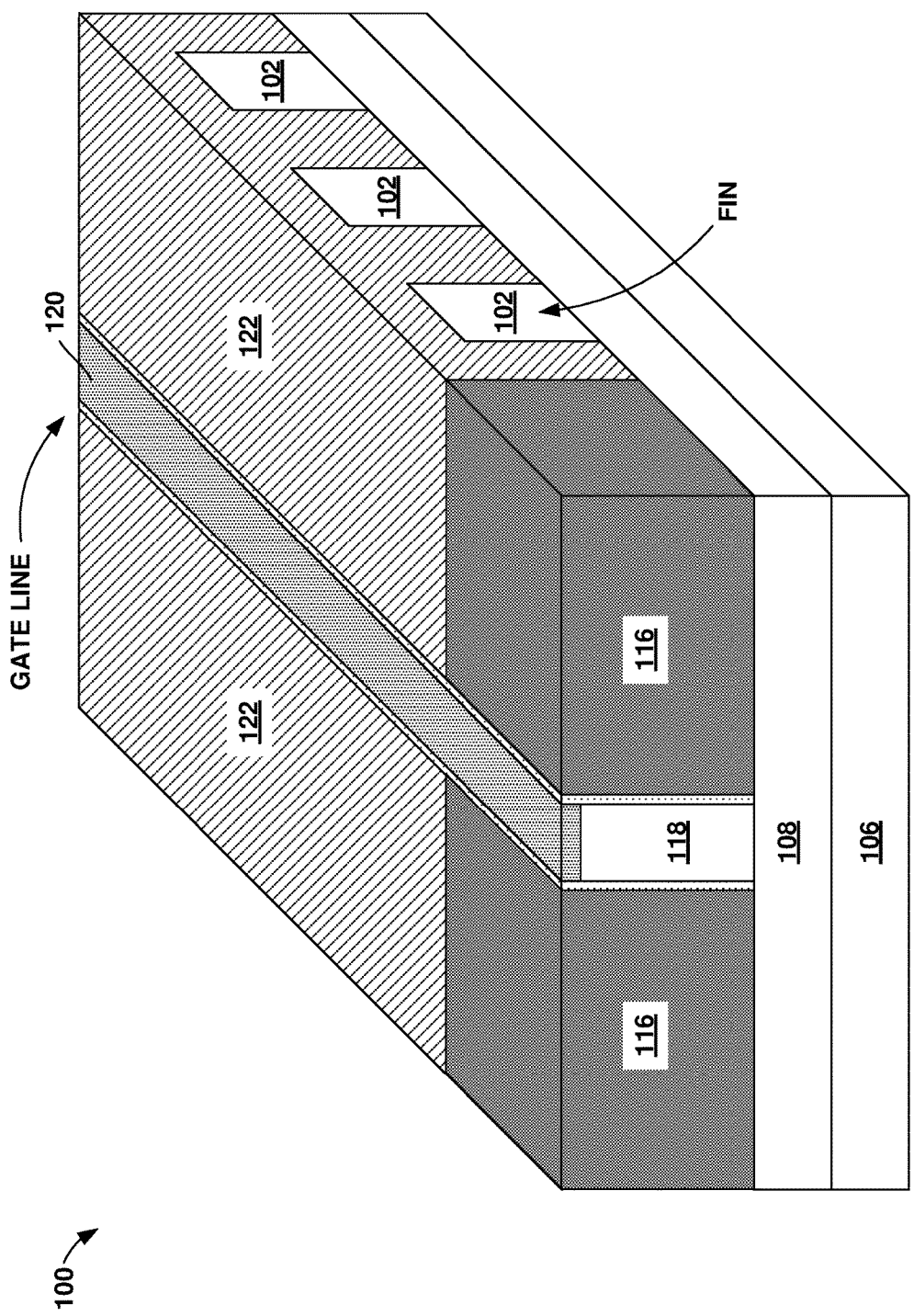
FIG. 10 is an isometric view of the finFET semiconductor device after forming replacing the dummy dielectric material with a fully strapped self-aligned trench silicide contact according to an exemplary embodiment.
Figure 11:
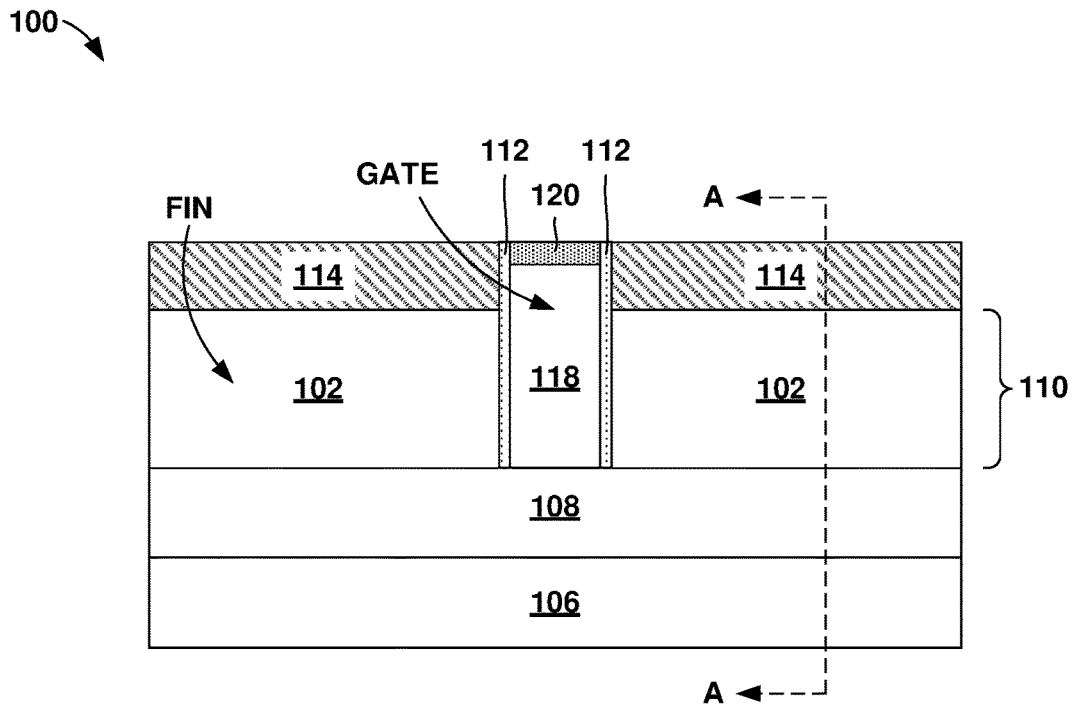
FIG. 11 is a cross section view of FIG. 12, taken along section line B-B according to an exemplary embodiment.
Figure 12:
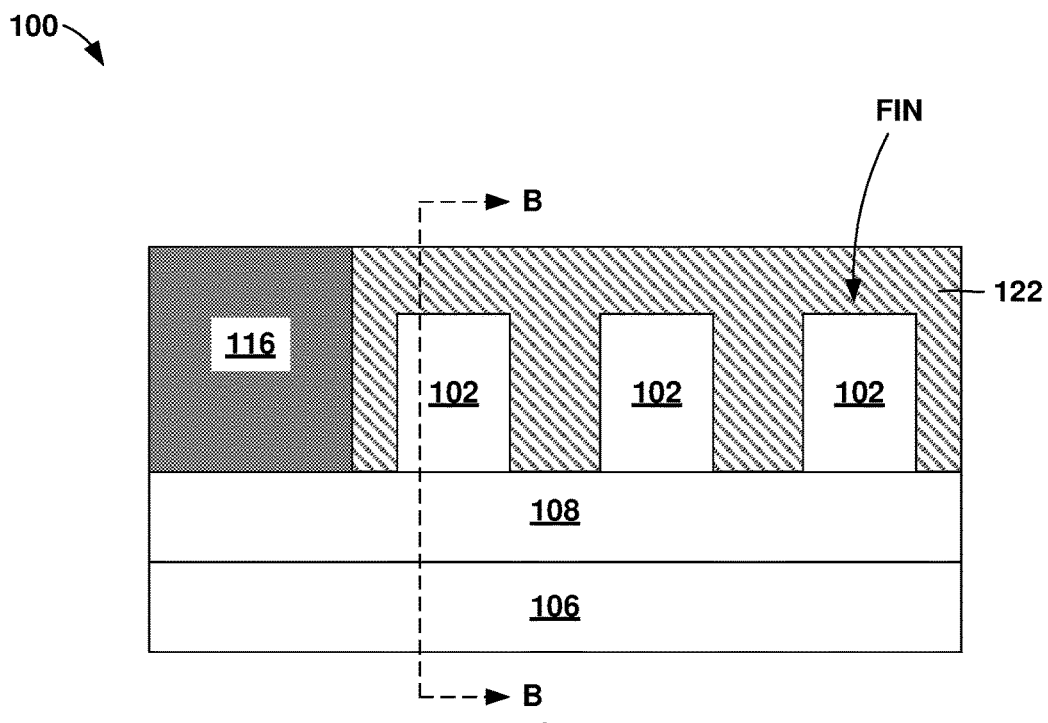
FIG. 12 is a cross section view of FIG. 11, taken along section line A-A according to an exemplary embodiment.

Referring now to FIGS. 10, 11, and 12, the structure 100 is shown after removing the dummy dielectric 114 and forming a self-aligned contact 122 in accordance with an embodiment of the present invention. Like above, FIG. 10 is an isometric view of the structure 100; FIG. 11 is a cross section view of FIG. 12 taken along section line B-B, and perpendicular to the fins 102; and FIG. 12 is a cross section view of FIG. 11 taken along section line A-A, and parallel to the fins 102. It should be noted that each device 100 will have a total of two contacts, one source contact and one drain contact. Additionally, in most cases, the self-aligned contact 122 is fabricated with nothing more than a sidewall spacer 112 separating it from the gate electrode 118.

The self-aligned contact 122 may be formed by any known technique and may be either n-doped or p-doped, and function as a merged or fully strapped source or drain of a resulting finFET device. Typically, n-doped source-drains are used for forming n-channel field effect transistors (n-FETs), and p-doped source-drains are used for forming p-channel field effect transistors (p-FETs). However, the source-drains of one device on a semiconductor substrate may be n-doped while the source-drains of another device on the same semiconductor substrate may be p-doped.

Methods well known in the art may be use to implant the source-drains either before, during or after forming the self-aligned contact 122. Thus the self-aligned contact 122 may be doped after being formed on exposed regions of the fins 102 in the active regions of the structure 100. In cases where both n-FETs and p-FETs are desired, masking materials, such as, for example, photoresist, $SiO_2$, $Si_3N_4$ or $HfO_2$, may be used to distinguish between the two different types of devices during the formation of the doped source-drain regions.

In an embodiment, a typical damascene technique may be performed to form the self-aligned contact 122 from conductive materials such as copper, aluminum, tungsten, cobalt, or some combination thereof. In another embodiment, a trench silicide process may be performed according to known techniques to form a silicide self-aligned contact 122. In such cases, the silicide contacts may include copper, aluminum, tungsten, cobalt, nickel, platinum. palladium, titanium, tantalum, zirconium, or some combination thereof. For example, the self-aligned contact 122 may include nickel silicide ($NiSi_x$), nickel platinum silicide ($NiPt_ySi_x$), cobalt silicide ($CoSi_x$), tantalum silicide ($TaSi_x$), and titanium silicide ($TiSi_x$).

In other embodiments, a metal layer may be deposited and a silicide formed at a bottom of a trench followed by a subsequent deposition process to fill the trench with any suitable conductive material, metal or semiconductor. For example, the fill may include copper, aluminum, tungsten, cobalt, nickel, platinum. palladium, titanium, tantalum, zirconium, or some combination thereof. In such cases, the silicide formed at the bottom of the trench may include the same or different metals as the material used to fill the trench.

In yet another embodiment, the self-aligned contact 122 may be formed or grown using an epitaxial growing process according to known techniques. For example, the self-aligned contact 122 may be grown at a temperature ranging from about 700° C. to about 1000° C., for example using a CVD, low-pressure (LP) CVD, ultra-high vacuum (UHV) CVD or any method known in art in conjunction with a silane, dichlorosilane, germane or other suitable precursor gas. The self-aligned contact 122 may be doped in-situ, for example, by adding $AsH_3$, $PH_3$, or $BH_3$ to the gas mixture. Alternatively, in one embodiment, the self-aligned contact 122 may be doped with a first type dopant, while the fins 102 may be doped with a second type dopant. In-situ doping refers to the doping technique in which the dopants are introduced into the self-aligned contact 122 at the same time the contacts are being grown. In-situ doping may be attractive because the dopant distribution can be uniform throughout the region if the dopant is incorporated during and along with the growth of the self-aligned contact 122. In one embodiment, the self-aligned contact 122 may have a thickness ranging from about 5 nm to about 20 nm, with a doping concentration within a range of about $5 \times 10^{19}$ atoms per $cm^3$ to about $1 \times 10^{21}$ atoms per $cm^3$.

In all cases, and as previously mentioned, the self-aligned contact 122 and the gate electrode 118 are separated by a short distance, or a width of a sidewall spacer 112, resulting in unwanted parasitic capacitance. Furthermore, the self-aligned contact 122 may generally be formed across multiple fins (102) and along an entire length of the merged source-drain regions thus resulting in a further increase in the already unwanted parasitic capacitance.

Finally, if necessary, a chemical mechanical polishing technique is used to remove any unreacted or excess metal or metal alloy from top surfaces of the structure 100, as depicted in the figures. After doing so, top surfaces of the gate cap 120, sidewall spacers 112, isolation region 116, and self-aligned contact 122 will be substantially flush with one another.

Figure 13:
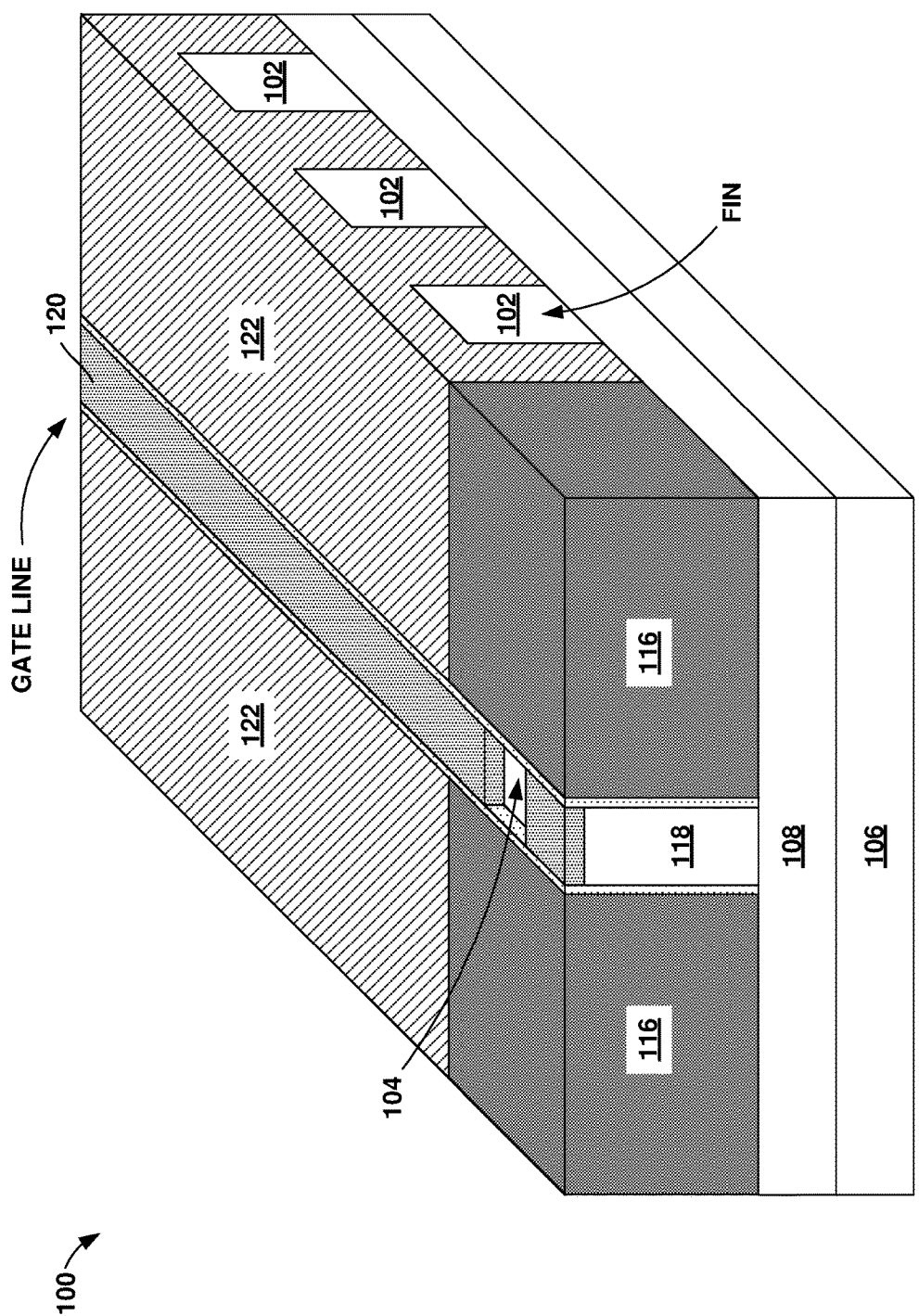
FIG. 13 is an isometric view of the finFET semiconductor device after patterning and etching to open or expose a top surface of the gate electrode according to an exemplary embodiment.
Figure 14:
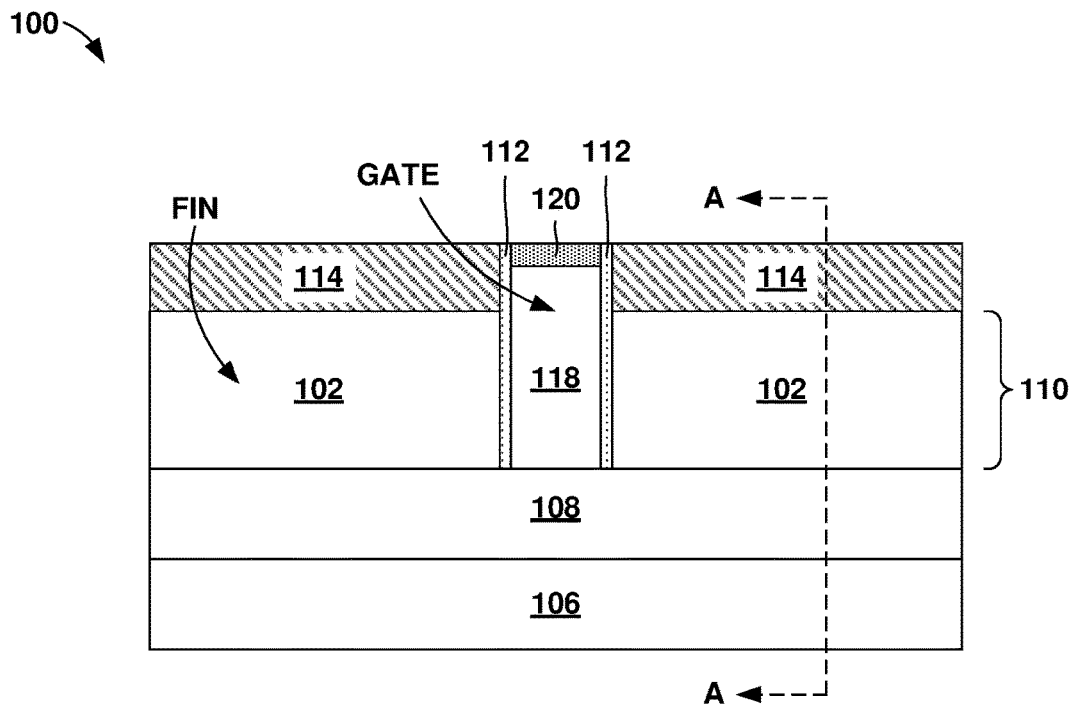
FIG. 14 is a cross section view of FIG. 15, taken along section line B-B according to an exemplary embodiment.
Figure 15:
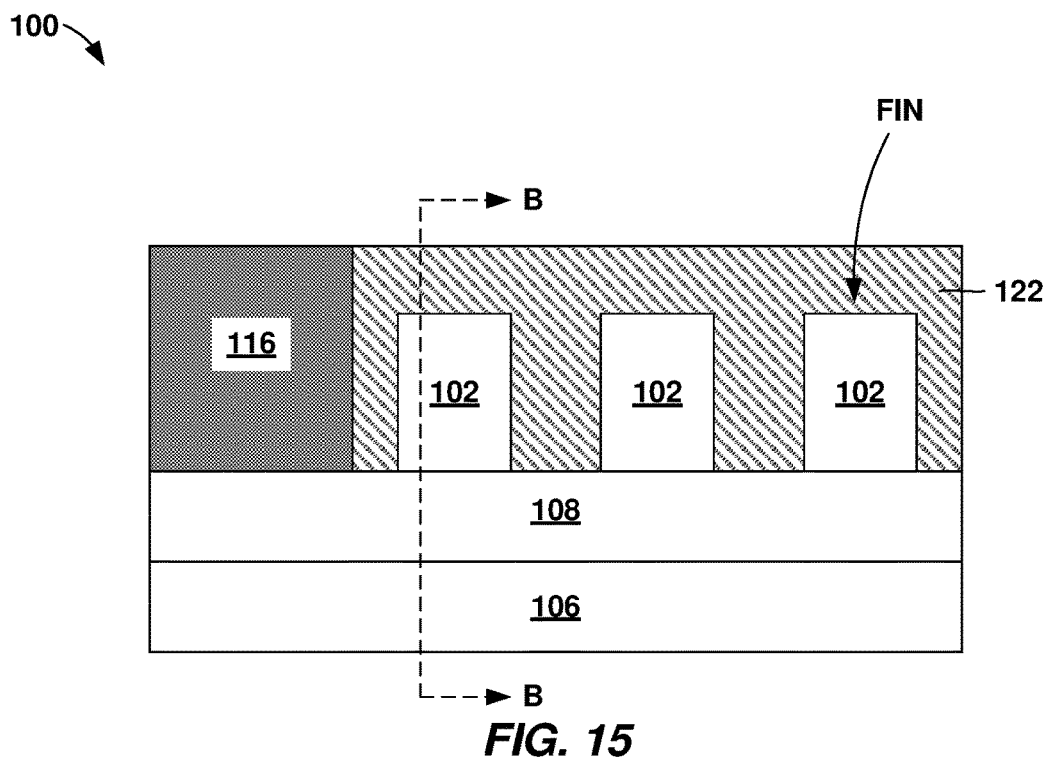
FIG. 15 is a cross section view of FIG. 14, taken along section line A-A according to an exemplary embodiment.

Referring now to FIGS. 13, 14, and 15, the structure 100 is shown after performing a patterning and etching technique to open or expose an upper surface of the gate electrode 118. Like above, FIG. 13 is an isometric view of the structure 100; FIG. 14 is a cross section view of FIG. 15 taken along section line B-B, and perpendicular to the fins 102; and FIG. 15 is a cross section view of FIG. 14 taken along section line A-A, and parallel to the fins 102. A portion of the gate cap 120 may be removed to expose an upper surface in order to subsequently form a gate contact in direct physical contact with the gate electrode 118. The portion of the gate cap 120 may be removed using, for example, any combination of known photolithography and etching techniques. In doing so, the trench silicide material of the self-aligned contact 122 may preferably be protected by a mask and remain untouched. For example, in an embodiment, a dry etching technique, such as, reactive ion etching may be used remove the portion of the gate cap 120 and expose the upper surface of the gate electrode 118. It should be noted that the gate open patterning described above may or may not produce an opening exactly as illustrated in FIG. 13, and the generally square or rectangular opening spanning from one sidewall spacer 112 to the other is shown for illustrative purposes only.

Figure 16:
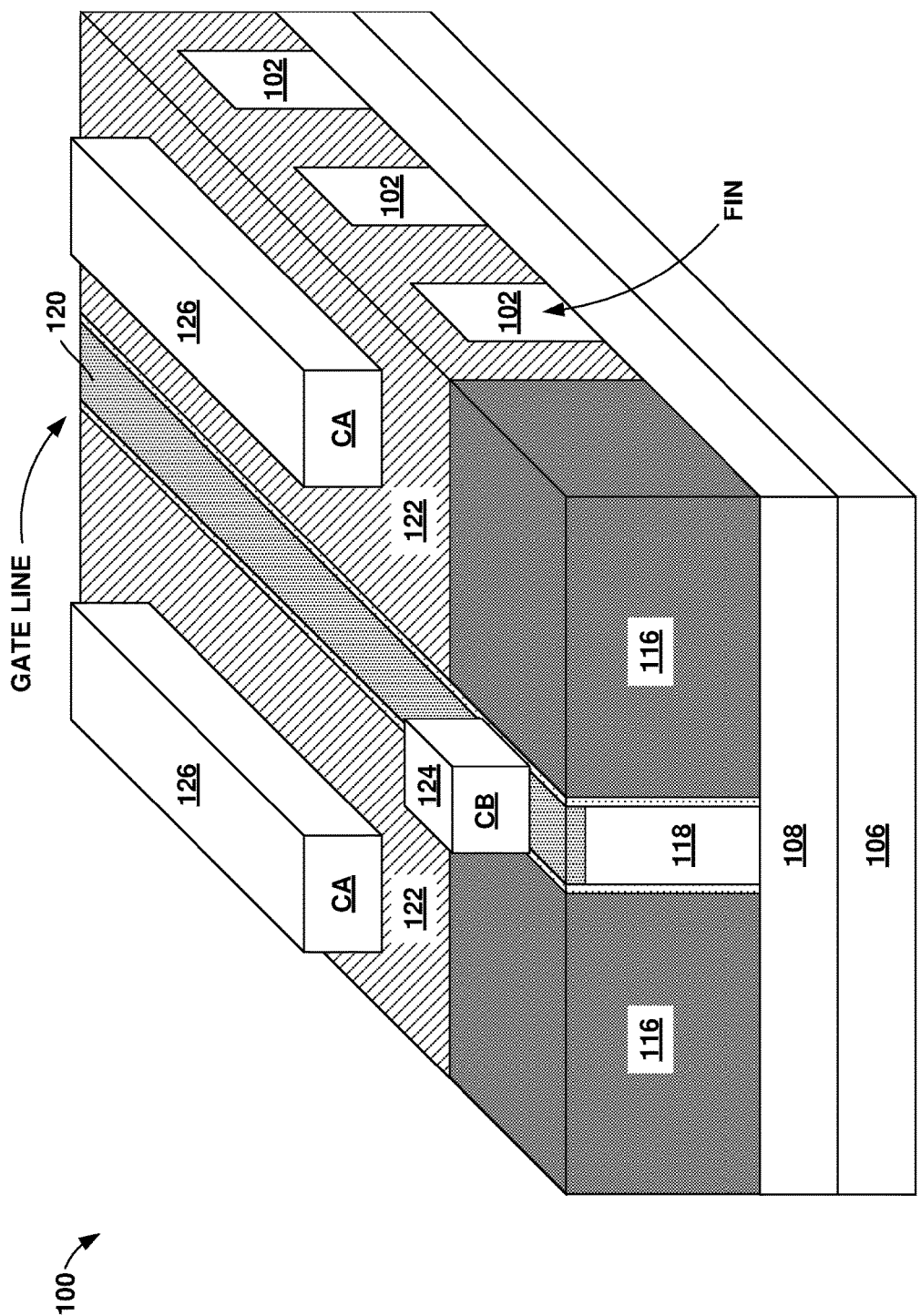
FIG. 16 is an isometric view of the finFET semiconductor device after patterning source-drain contacts (CA) and a gate contact (CB) from a blanket metal layer according to an exemplary embodiment.
Figure 17:
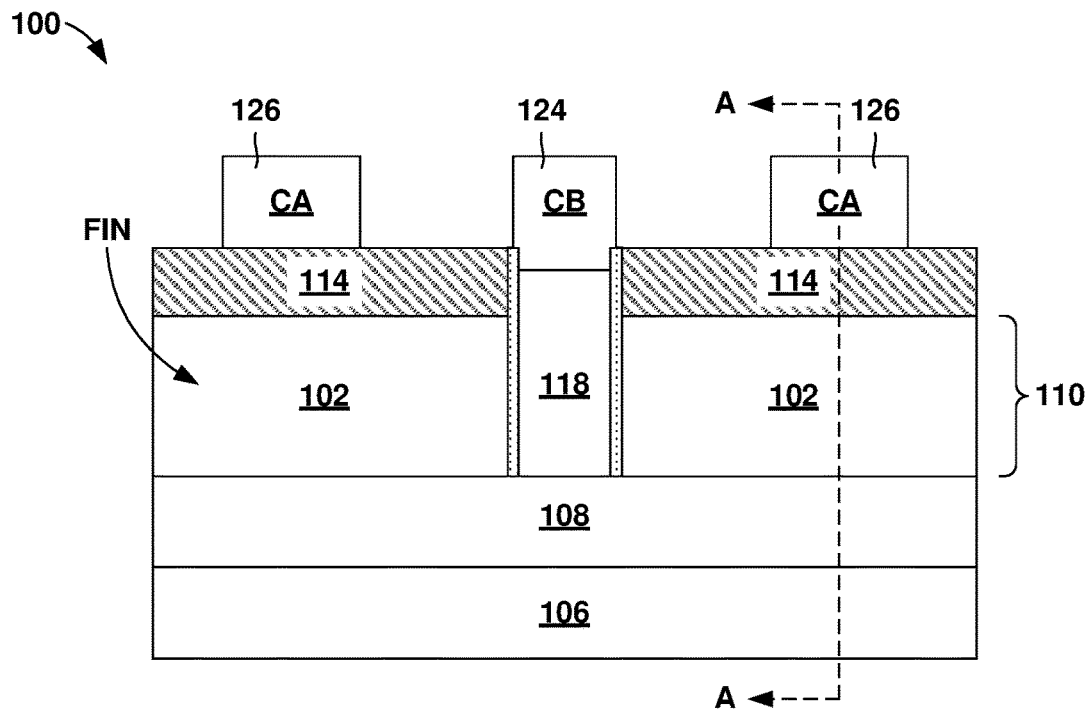
FIG. 17 is a cross section view of FIG. 18, taken along section line B-B according to an exemplary embodiment.
Figure 18:
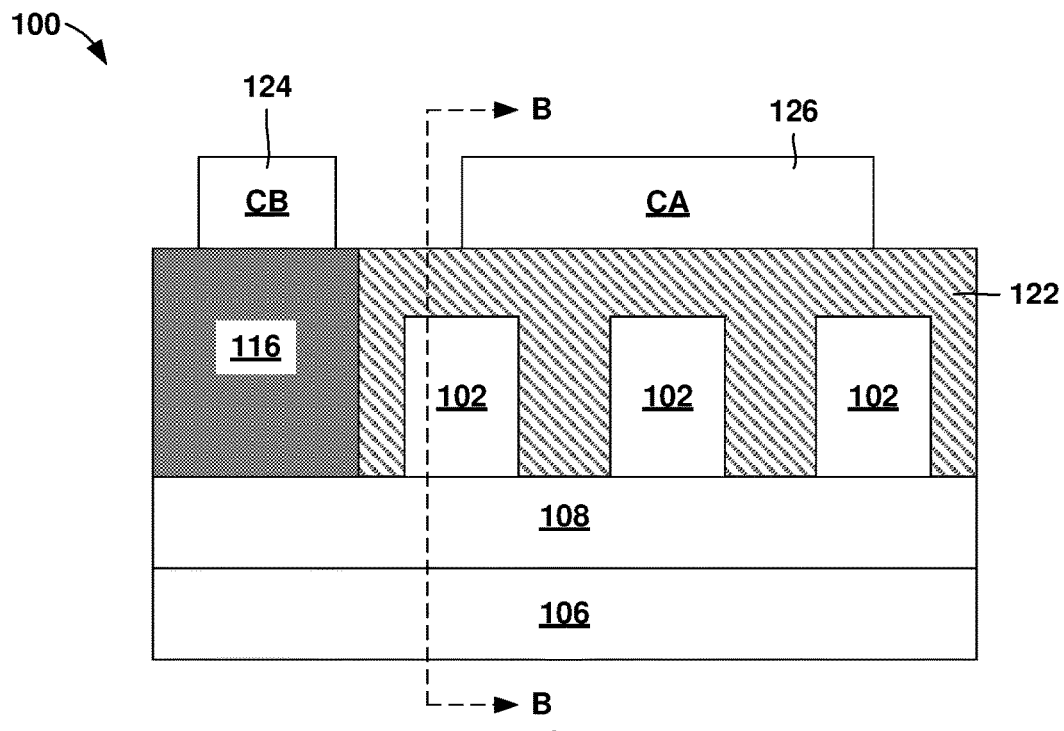
FIG. 18 is a cross section view of FIG. 17, taken along section line A-A according to an exemplary embodiment.

Referring now to FIGS. 16, 17, and 18, the structure 100 is shown after forming both a gate contact 124 and source drain contacts 126, otherwise referred to as CB and CA contacts, respectively, in accordance with an embodiment of the present invention. Like above, FIG. 16 is an isometric view of the structure 100; FIG. 17 is a cross section view of FIG. 18 taken along section line B-B, and perpendicular to the fins 102; and FIG. 18 is a cross section view of FIG. 17 taken along section line A-A, and parallel to the fins 102.

The gate contact 124 and the source drain contacts 126 may be formed by any suitable technique known in the art. Formation of the both the gate contact 124 and the source drain contacts 126 may include depositing a blanket metal layer, lithographically patterning a mask above the metal layer, and removing a portion of the metal layer. The metal layer may be formed using conventional deposition methods, for example, chemical vapor deposition, low-pressure chemical vapor deposition, atomic layer deposition, or physical vapor deposition. The metal layer, and thus the contacts (124, 126), may include any metal suitable for interconnect structures, such as, for example copper, aluminum, tungsten, cobalt, or some combination thereof. Furthermore, the metal layer, and thus the contacts, may be any suitable thickness preferred for their intended function.

After the metal layer is deposited above the self-aligned contact 122 and above the gate electrode 118, a photoresist material may be deposited above the metal layer and lithographically patterned to form the mask. The photoresist material may be patterned by exposing the photoresist to a desired pattern of radiation and developing the exposed photoresist utilizing a conventional resist developer. The mask or pattern in the photoresist may then be transferred to the metal layer using one or more dry etching techniques. Suitable dry etching techniques may include, but are not limited to: reactive ion etching (RIE), ion beam etching, plasma etching, or laser ablation. In an embodiment, a selective tungsten RIE technique using, for example, a chlorine based etchant including $BCl_3$, $CHCl_3$, or $Cl_2$, may be used to transfer the mask pattern into the metal layer and thus form the gate contact 124 and the source drain contacts 126. Such a selective tungsten RIE technique will be very selective to insulator materials previously used to form the pair of sidewall spacers 112, the isolation region 116, and the gate cap 120.

Figure 19:
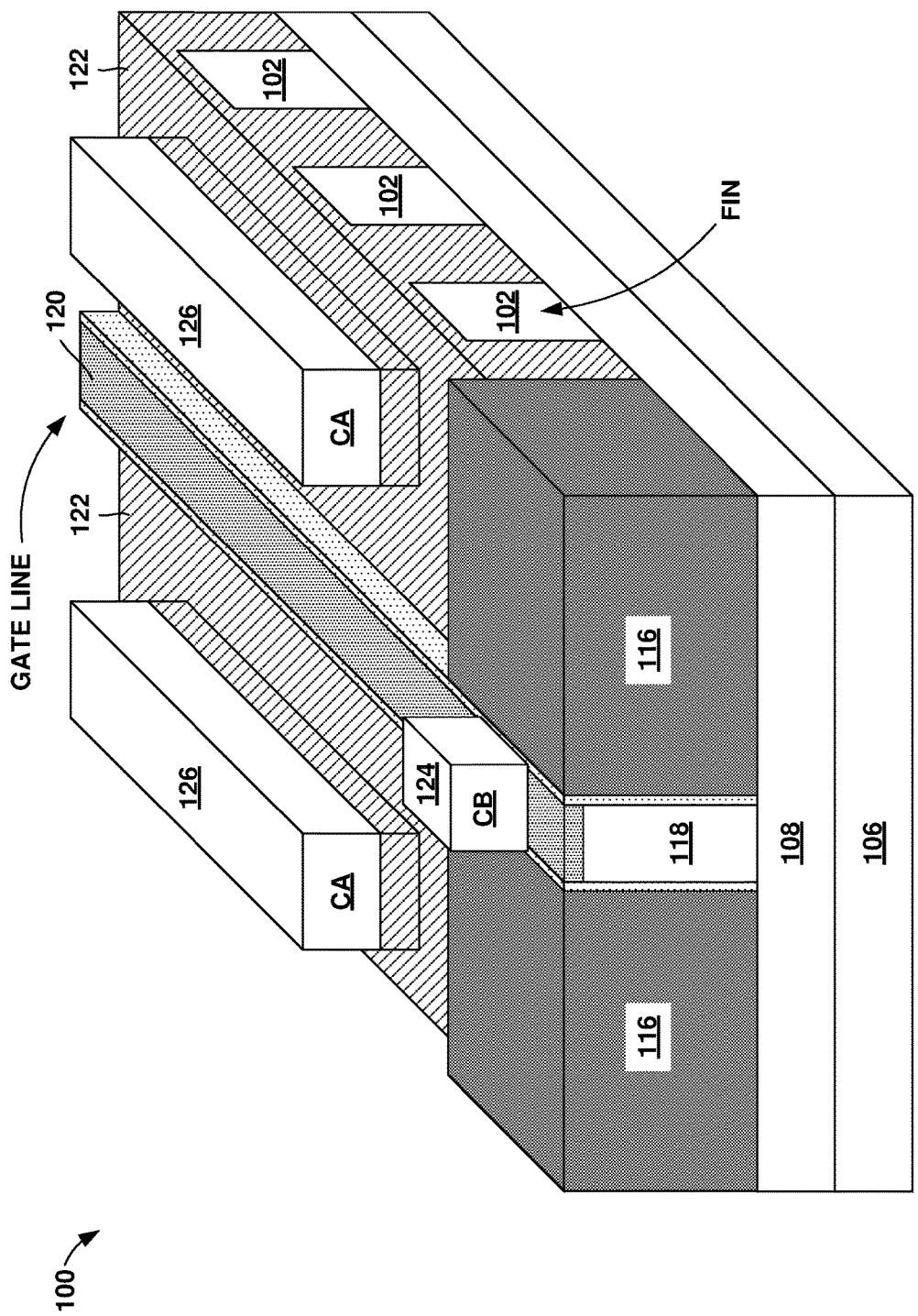
FIG. 19 is an isometric view of the finFET semiconductor device after recessing the fully strapped self-aligned trench silicide contact according to an exemplary embodiment.
Figure 20:
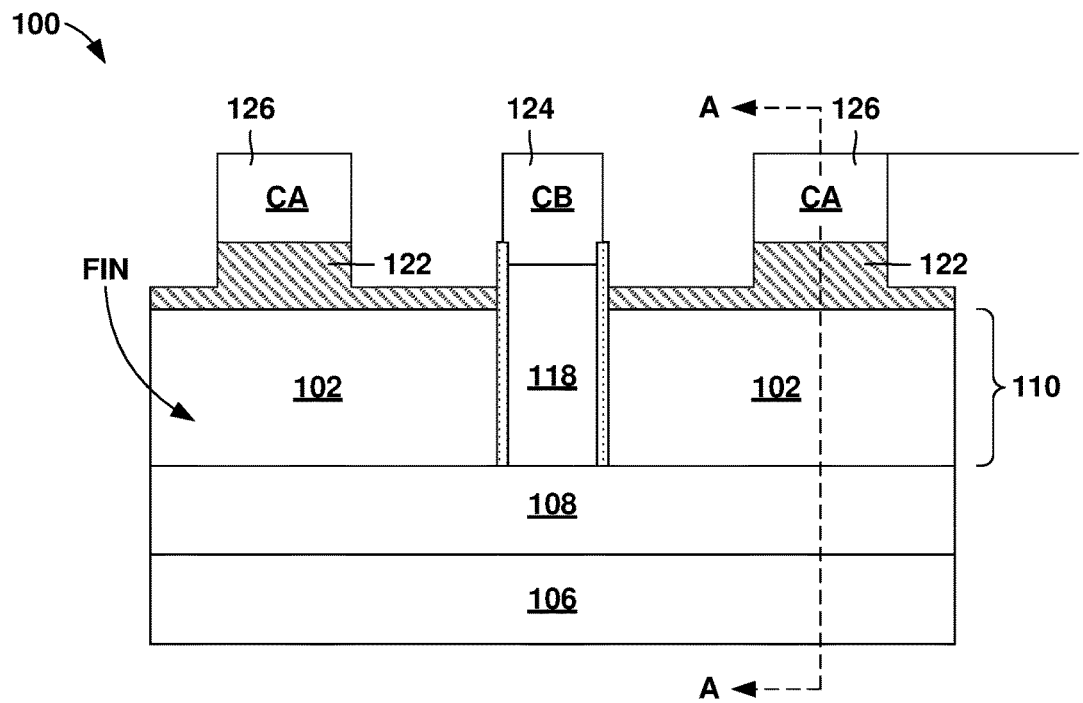
FIG. 20 is a cross section view of FIG. 21, taken along section line B-B according to an exemplary embodiment.
Figure 21:
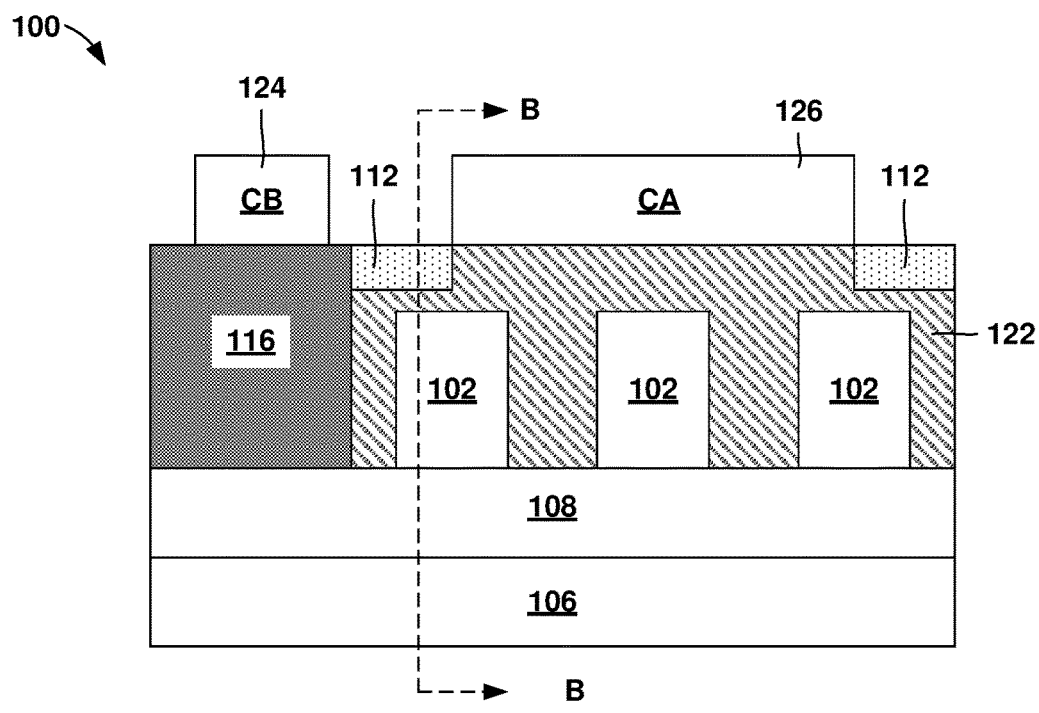
FIG. 21 is a cross section view of FIG. 20, taken along section line A-A according to an exemplary embodiment.

Referring now to FIGS. 19, 20, and 21, the structure 100 is shown after recessing a portion of the self-aligned contact 122. Like above, FIG. 19 is an isometric view of the structure 100; FIG. 20 is a cross section view of FIG. 21 taken along section line B-B, and perpendicular to the fins 102; and FIG. 21 is a cross section view of FIG. 20 taken along section line A-A, and parallel to the fins 102. Next, according to an embodiment, before the patterned photoresist used to pattern the contacts is removed, the etching technique may be continued for an additional period of time to remove "excess" conductive material from the self-aligned contact 122. The removed material may be referred to as "excess" because it is not needed to produce a fully functional device. More specifically, some of the functional requirements of the self-aligned contact 122 are that it electrically joins or connects multiple active fin regions and provides an electrical connection between the active fin regions and the source drain contact 126. Therefore, the entire self-aligned contact 122 need not be the same height as the gate line, as it would without the continued overetch described above.

Removing "excess" material from the self-aligned contact 122 will purposefully recess a portion the self-aligned contact 122 in order to reduce, and preferably, minimize contact-to-gate capacitance. Alternatively, the patterned photoresist used to pattern the contacts may be removed, and a different mask may be used to etch the self-aligned contact 122; however, due to process variation, doing so will not minimize the parasitic capacitance between the contacts and the gate by maximizing the removal of "excess" material.

Over etching will preferably be carried out for as long as possible without exposing the fins 102. In an embodiment, the self-aligned contact 122 will be recessed to a height approximately 5 nm about the fins 102. Additionally, if process variation during etching is ±10 nm, then etching should be calibrated to recess the self-aligned contact 122 to a height approximately 15 nm about the fins 102. Therefore, if the fin height is about 45 nm, the target height of the self-aligned contact 122, measured from an upper surface of the buried dielectric layer 108, will be approximately 60 nm.

As previously stated, the over etch duration will be as long as possible to remove as much of the self-aligned contact 122 as possible without exposing the fins 102. In an embodiment, the over etch duration may range from 10 second to 15 seconds depending on etch rate.

The patterned photoresist (mask) may subsequently be removed by resist stripping after etching has been completed. The mask may include well known photoresist materials, for example, a soft mask, and could be either positive or negative in tone. Optionally, a non-contact or a hardmask may be used.

Figure 22:
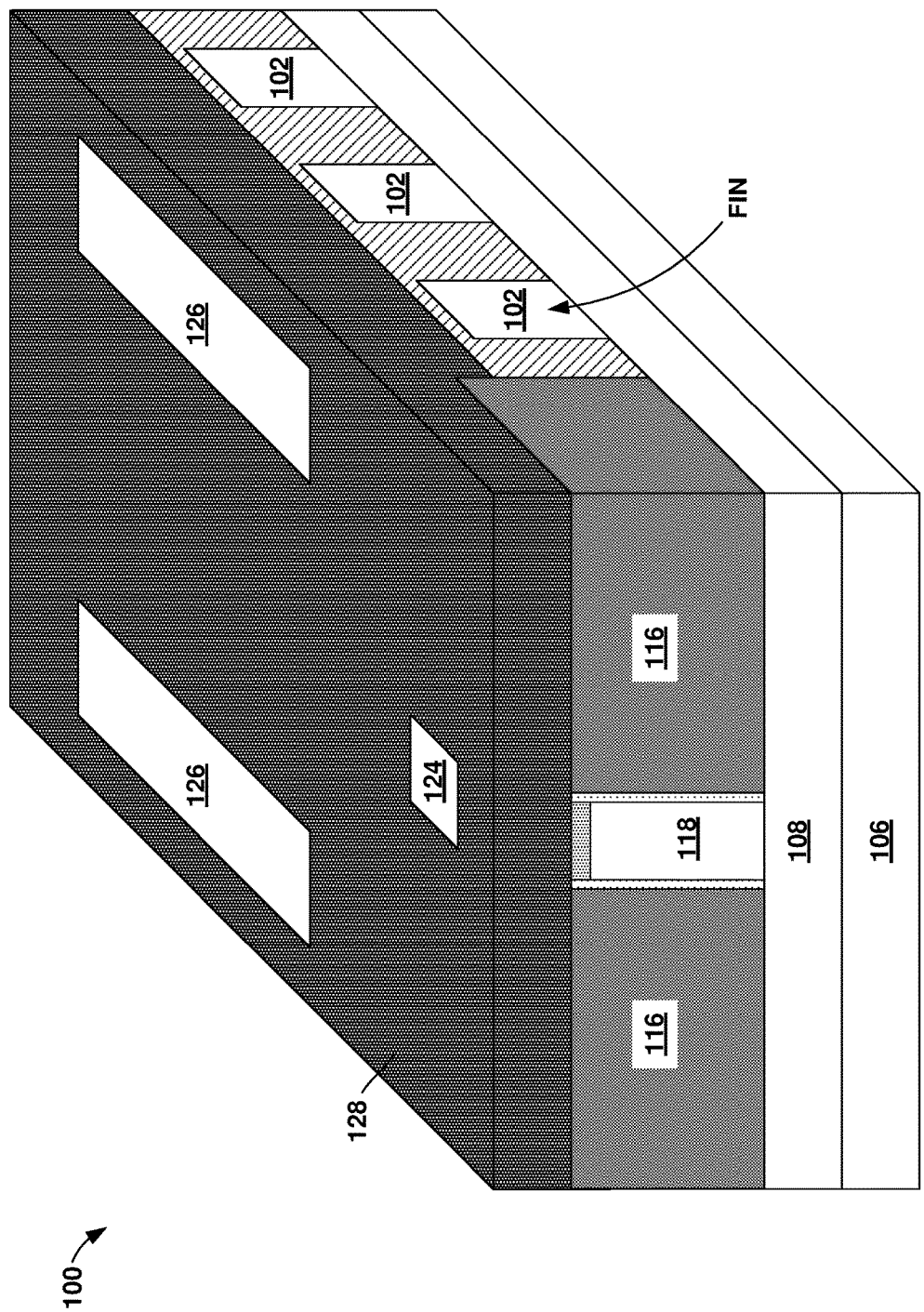
FIG. 22 is an isometric view of the finFET semiconductor device after depositing an inter-level dielectric layer according to an exemplary embodiment.
Figure 23:
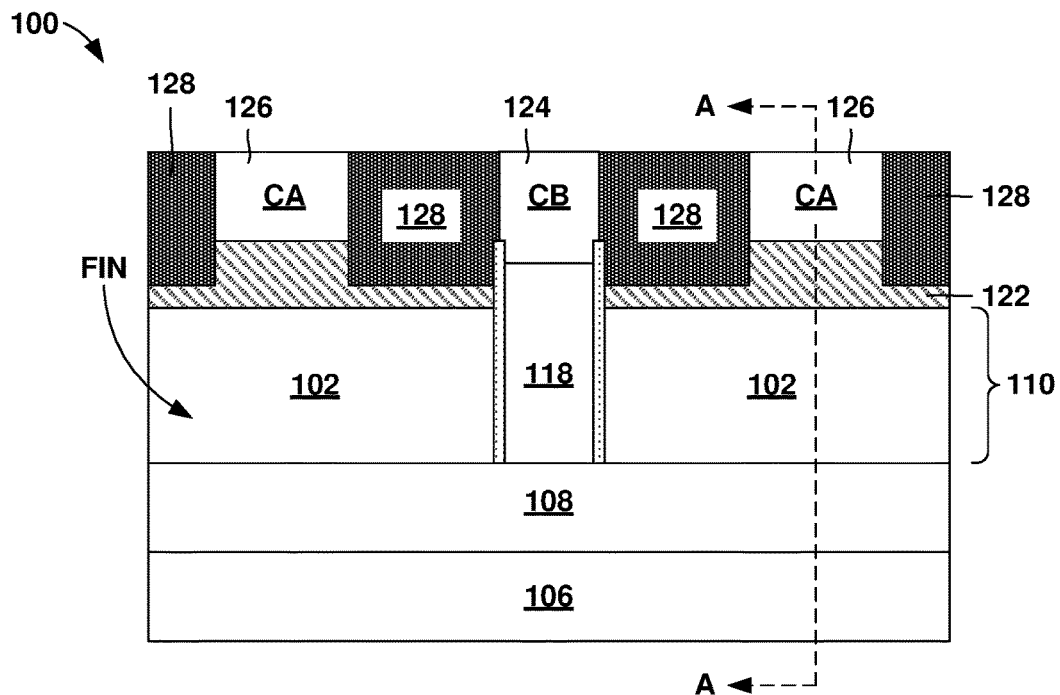
FIG. 23 is a cross section view of FIG. 24, taken along section line B-B according to an exemplary embodiment.
Figure 24:
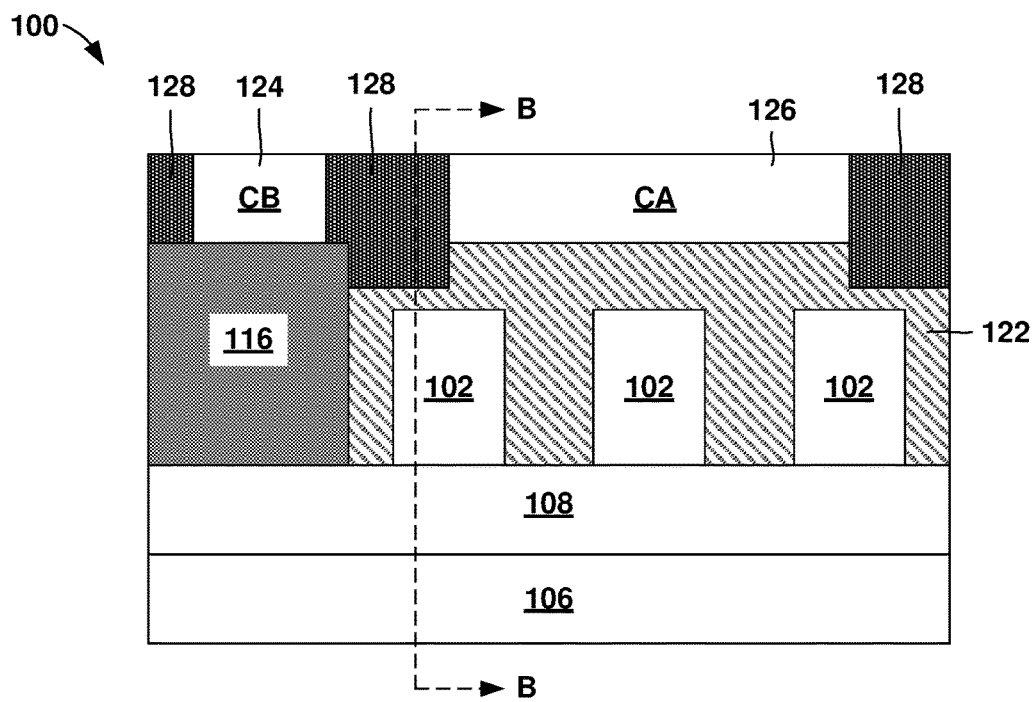
FIG. 24 is a cross section view of FIG. 23, taken along section line A-A according to an exemplary embodiment.

Referring now to FIGS. 22, 23, and 24 the structure 100 is shown after depositing an interlevel dielectric layer 128 (hereinafter "dielectric layer") in accordance with an embodiment of the present invention. Like above, FIG. 22 is an isometric view of the structure 100; FIG. 23 is a cross section view of FIG. 24 taken along section line B-B, and perpendicular to the fins 102; and FIG. 24 is a cross section view of FIG. 23 taken along section line A-A, and parallel to the fins 102.

The dielectric layer 128 may be deposited to electrically insulate the contacts from one another and prepare for subsequent processing. The dielectric layer 128 may include any suitable dielectric material, for example, oxide, nitride, silicon oxide (SiO$_2$), silicon nitride (Si$_3$N$_4$), hydrogenated silicon carbon oxide (SiCOH), silicon based low-k dielectrics, porous dielectrics, or some combination thereof. Known suitable deposition techniques, such as, for example, atomic layer deposition, chemical vapor deposition, plasma enhanced chemical vapor deposition, spin on deposition, or physical vapor deposition may be used to form the dielectric layer 128. Next, a chemical mechanical polishing technique may be applied to remove excess material from a top surface of the structure 100 and expose top surfaces of the source drain contacts 126.

Figure 25:
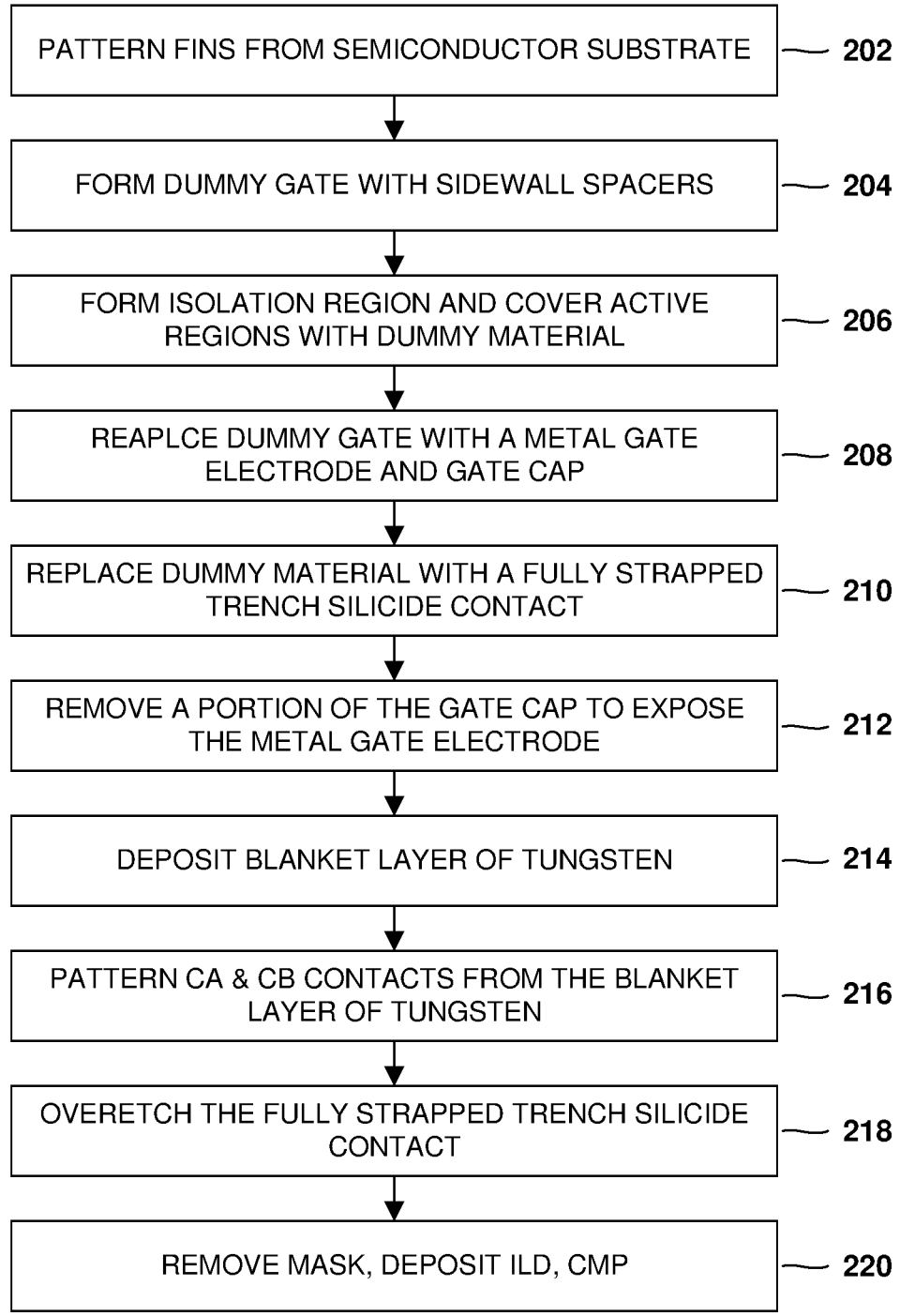
FIG. 25 is flowchart depicting operational steps of a process for fabricating a self-aligned contact with reduced contact-to-gate capacitance according to an exemplary embodiment.

Referring now to FIG. 25, a flowchart depicting the operational steps of recessing a portion of the strapped contact, as illustrated above with reference to FIGS. 1-24, is shown in accordance with an embodiment of the present invention. At an intermediate stage of a larger semiconductor manufacturing process, the process may begin with patterning semiconductor fins from a semiconductor substrate, at 202. Next, the process may include forming a dummy gate and sidewall spacers, for example, gate spacers, at 204. Next, the process may continue with forming an isolation region and covering active regions with a dummy dielectric material, at 206. Next the process may include replacing the dummy gate with a metal gate electrode and gate cap, at 208. Next the process may continue with replacing the dummy dielectric material with a fully strapped trench silicide contact, at 210. Next the process may include removing a portion of the gate cap to expose the metal gate electrode, at 212. Next the process may continue with depositing a blanket layer of tungsten, at 214. Next the process may include patterning CA and CB contacts from the blanket layer of tungsten, at 216. Next the process may continue with over etching the fully strapped self-aligned trench silicide contact prior to removing the photoresist or mask used to pattern, at least, the CA contacts, at 218. Finally, the process may conclude with removing the photoresist, depositing an inter-level dielectric material, and performing a chemical mechanical polishing technique, at 220.

Another embodiment by which to fabricate the self-aligned contacts with reduced contact-to-gate capacitance is described in detail below by referring to the accompanying drawings FIGS. 26-35. In the present embodiment, a portion of the strapped contact (122) is recessed to remove excess conductive material prior to forming the gate contact 124. In other words, the gate contact 124 is formed after the source drain contacts 126 and after recessing the self-aligned contact 122.

Figure 26:
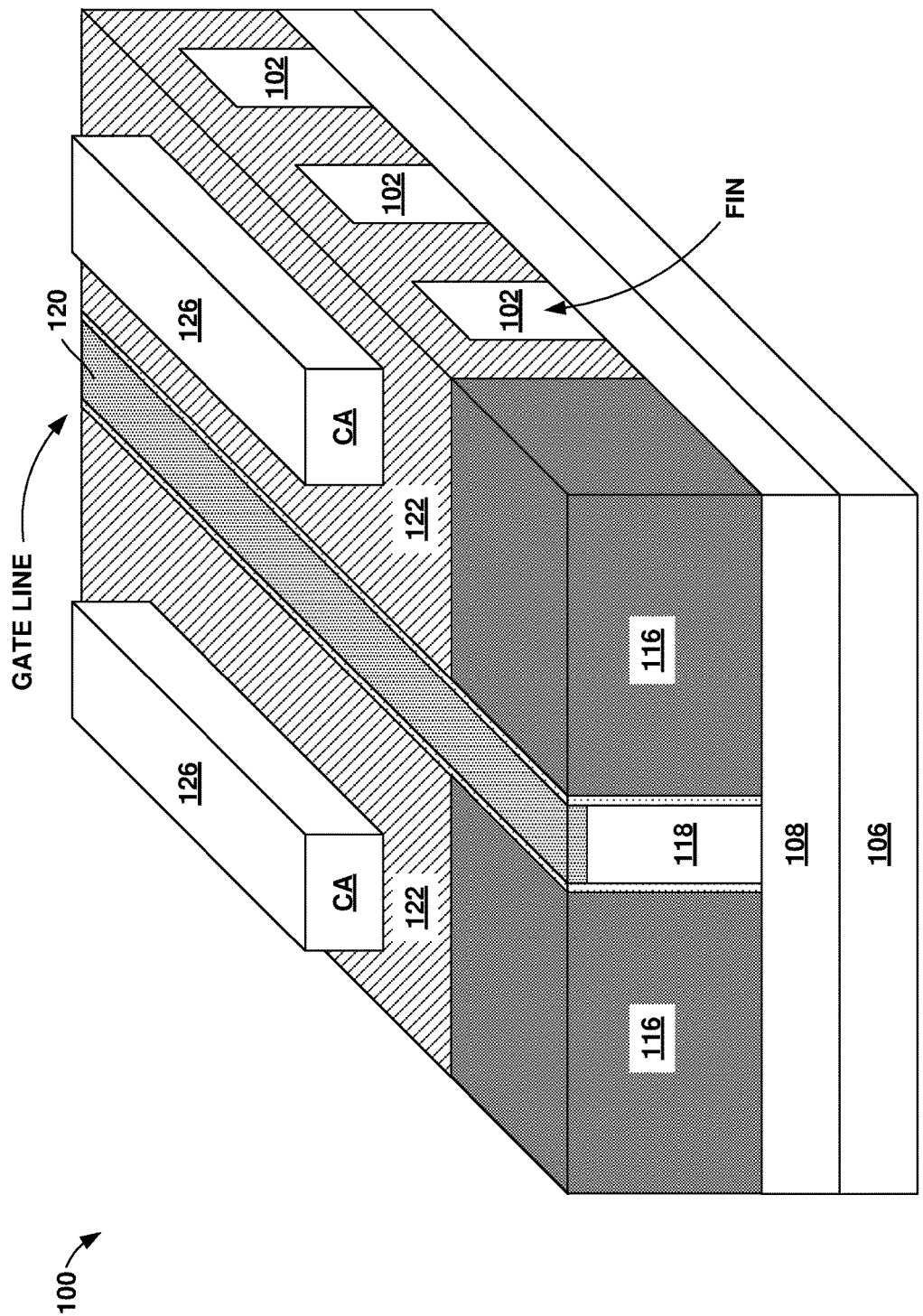
FIG. 26 is an isometric view of the finFET semiconductor device after patterning only the source-drain contacts (CA) from a blanket metal layer according to an exemplary embodiment.
Figure 27:
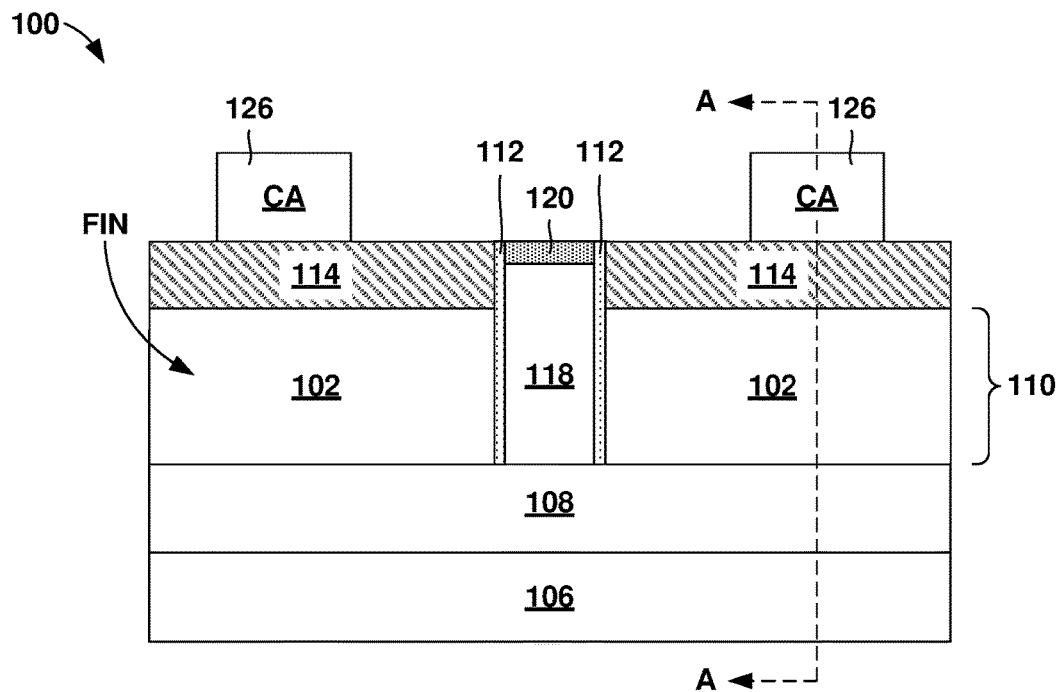
FIG. 27 is a cross section view of FIG. 28, taken along section line B-B according to an exemplary embodiment.
Figure 28:
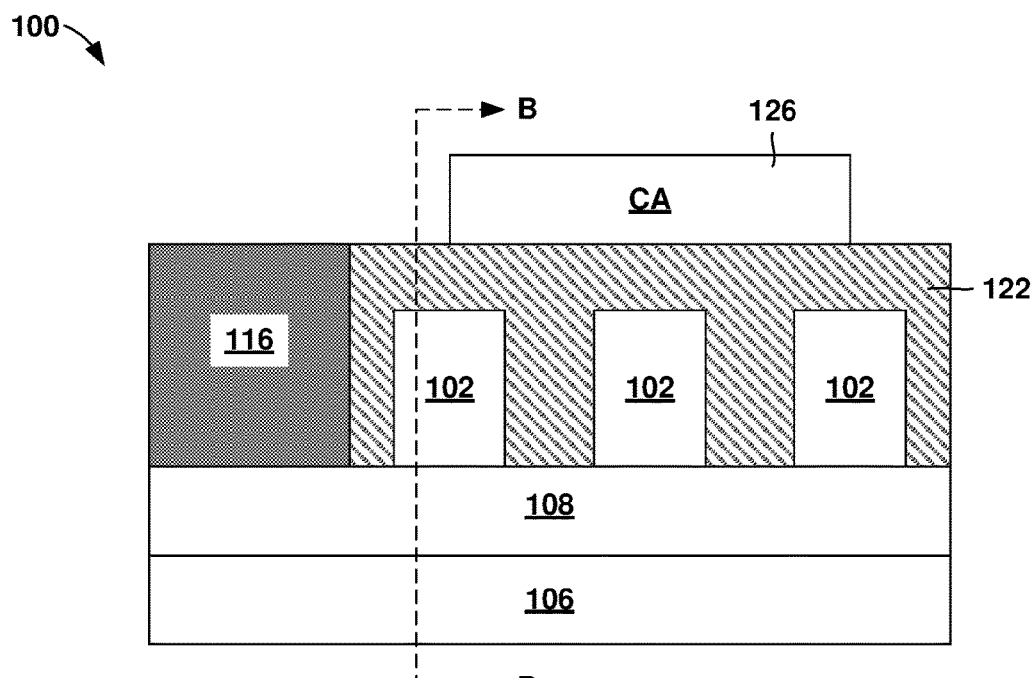
FIG. 28 is a cross section view of FIG. 27, taken along section line A-A according to an exemplary embodiment.

Referring now to FIGS. 26, 27, and 28, the structure 100 is shown at an intermediate step of fabrication after forming only the source drain contacts 126, in accordance with an embodiment of the present invention. Like above, FIG. 26 is an isometric view of the structure 100; FIG. 27 is a cross section view of FIG. 28 taken along section line B-B, and perpendicular to the fins 102; and FIG. 28 is a cross section view of FIG. 27 taken along section line A-A, and parallel to the fins 102.

In the present embodiment, only the source drain contacts 126 may be formed by any suitable technique known in the art. As described above with reference to FIGS. 16, 17 and 18, formation of the source drain contacts 126 includes depositing a blanket metal layer, lithographically patterning a mask above the metal layer, and removing a portion of the metal layer. Also like above, the chosen patterning techniques will be very selective to insulator materials previously used to form the pair of sidewall spacers 112, the insolation region 116, and the gate cap 120.

Figure 29:
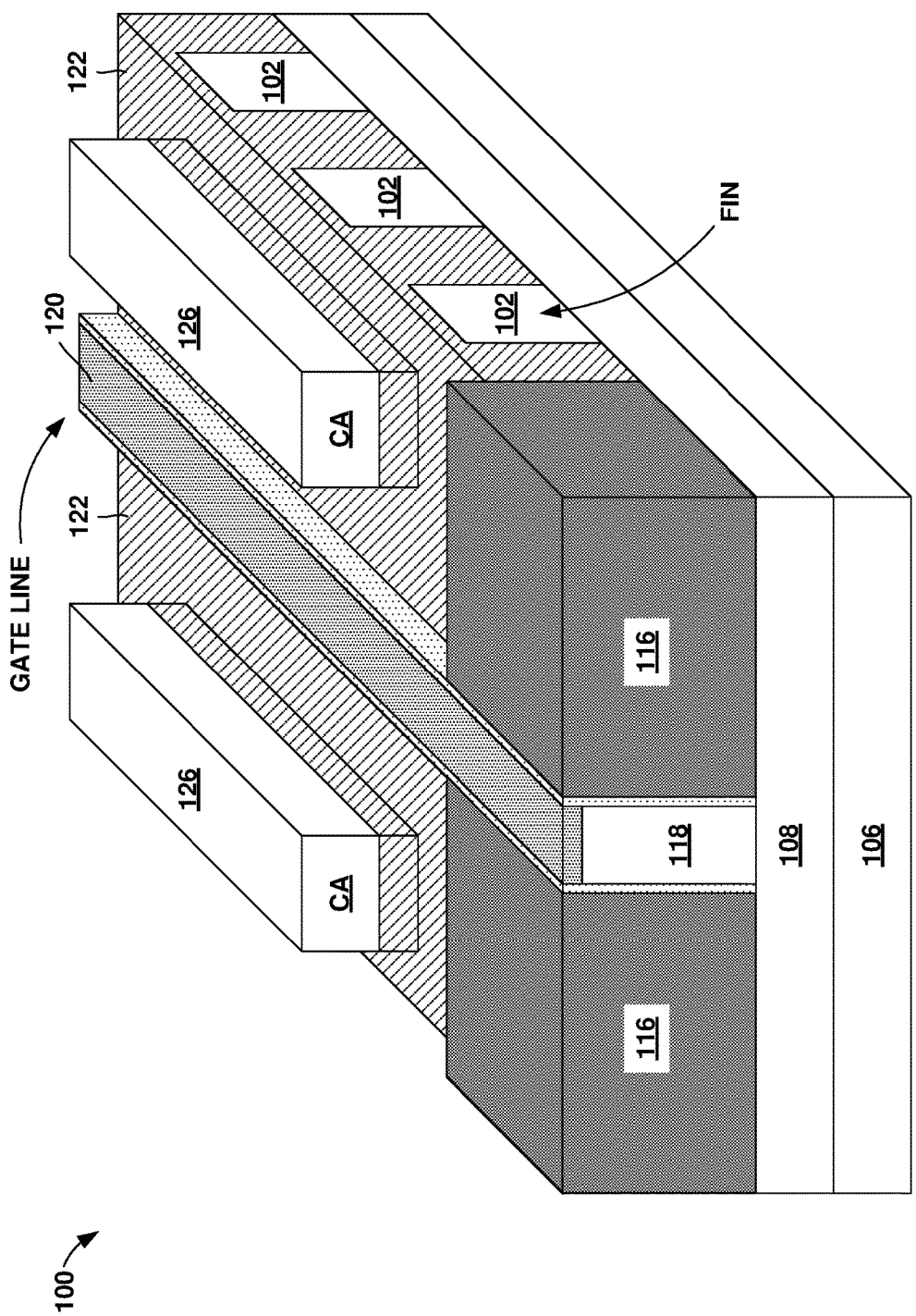
FIG. 29 is an isometric view of the finFET semiconductor device after recessing the fully strapped self-aligned trench silicide contact according to an exemplary embodiment.
Figure 30:
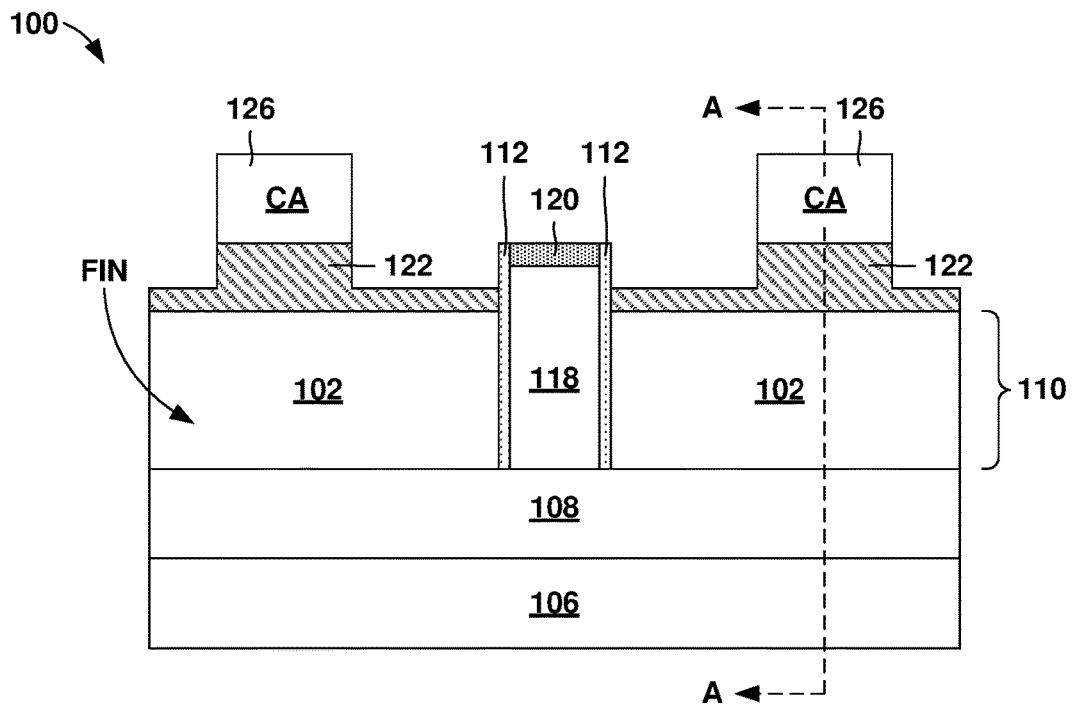
FIG. 30 is a cross section view of FIG. 31, taken along section line B-B according to an exemplary embodiment.
Figure 31:
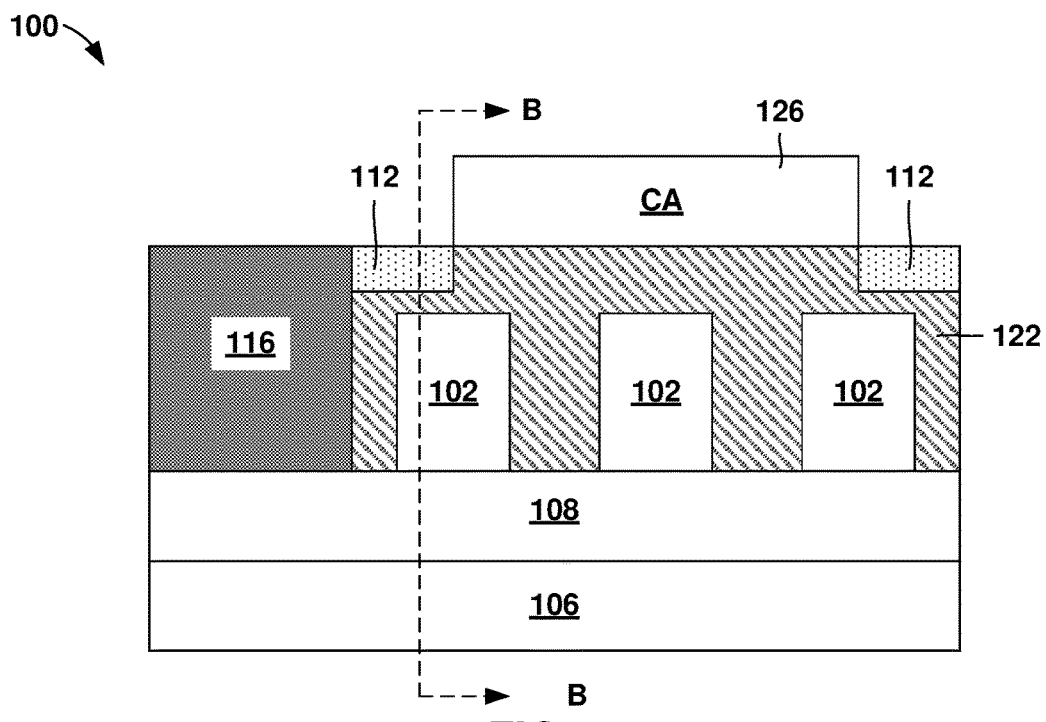
FIG. 31 is a cross section view of FIG. 30, taken along section line A-A according to an exemplary embodiment.

Referring now to FIGS. 29, 30, and 31, the structure 100 is shown after recessing a portion of the self-aligned contact 122, in accordance with an embodiment of the present invention. Like above, FIG. 29 is an isometric view of the structure 100; FIG. 30 is a cross section view of FIG. 31 taken along section line B-B, and perpendicular to the fins 102; and FIG. 31 is a cross section view of FIG. 30 taken along section line A-A, and parallel to the fins 102. As described above with reference to FIGS. 19, 20 and 21, the etching technique used to form the source drain contacts 126 may be continued for an additional period of time to remove "excess" conductive material from the self-aligned contact 122.

Figure 32:
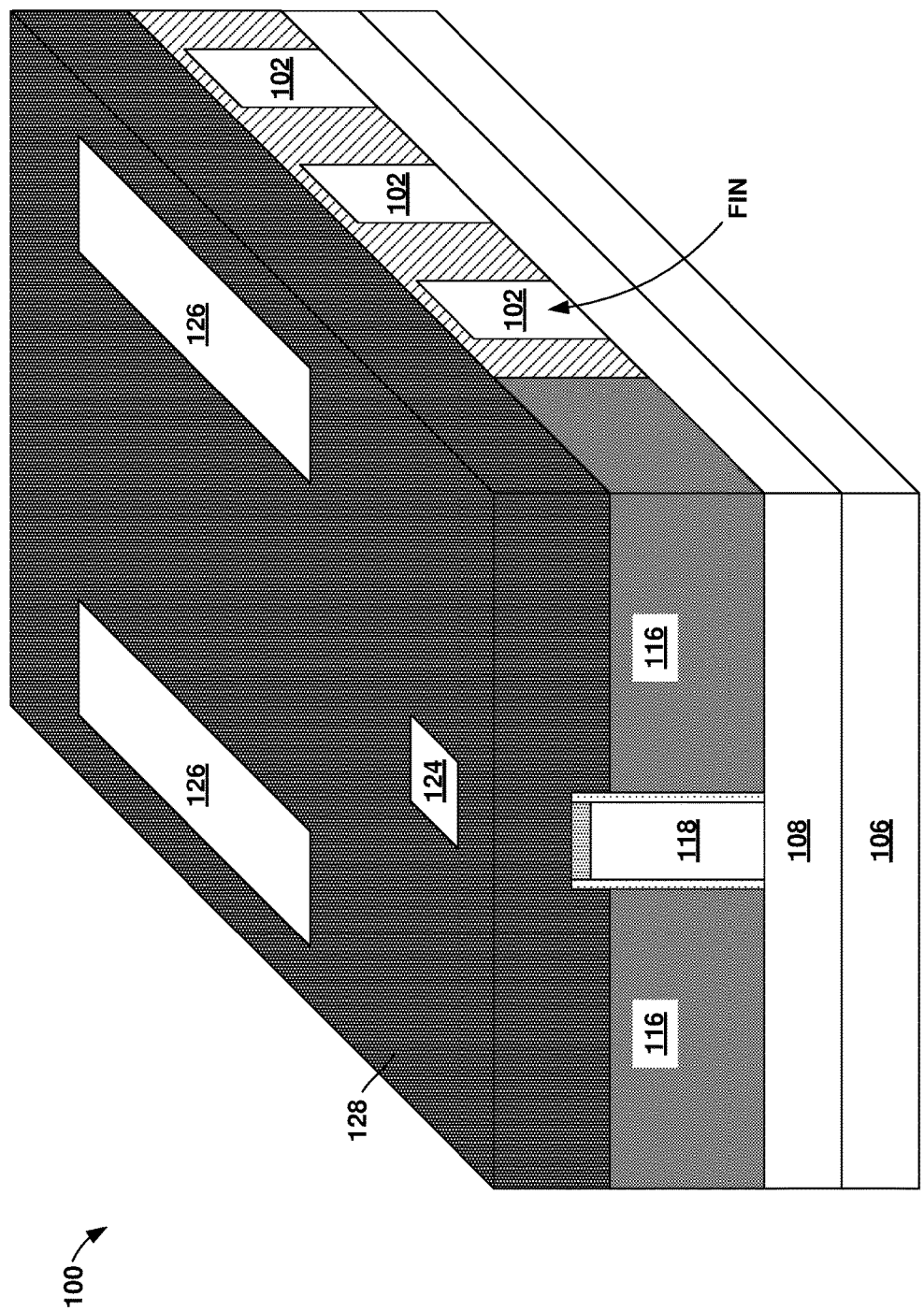
FIG. 32 is an isometric view of the finFET semiconductor device after depositing an inter-level dielectric layer and forming a gate contact according to an exemplary embodiment.
Figure 33:
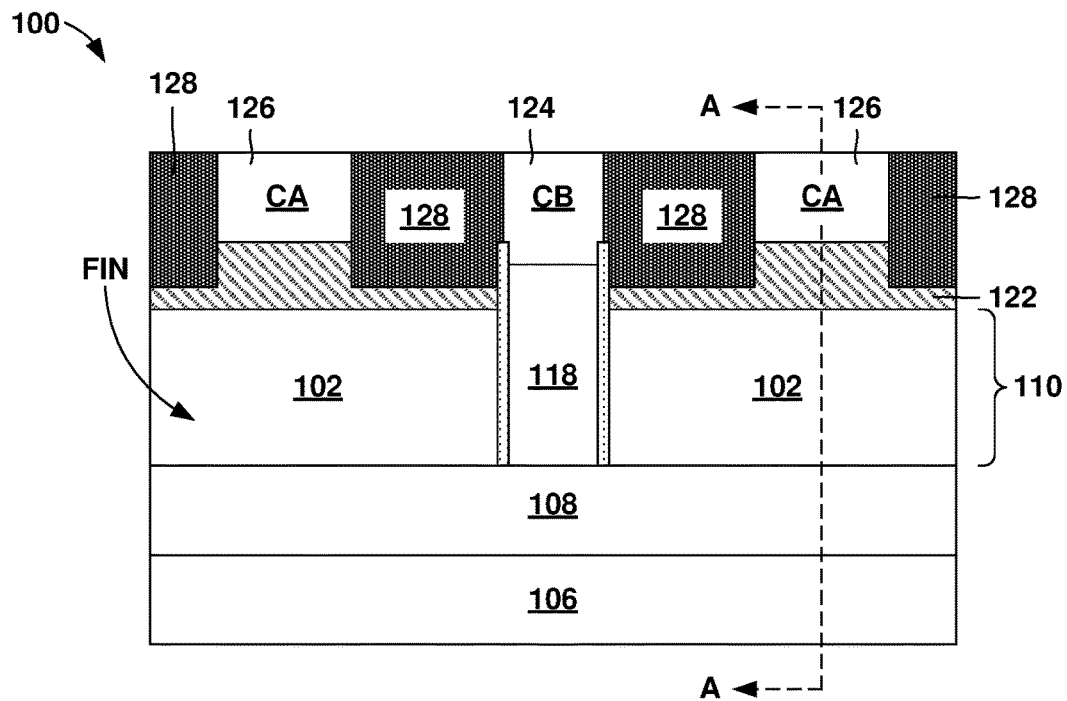
FIG. 33 is a cross section view of FIG. 34, taken along section line B-B according to an exemplary embodiment.
Figure 34:
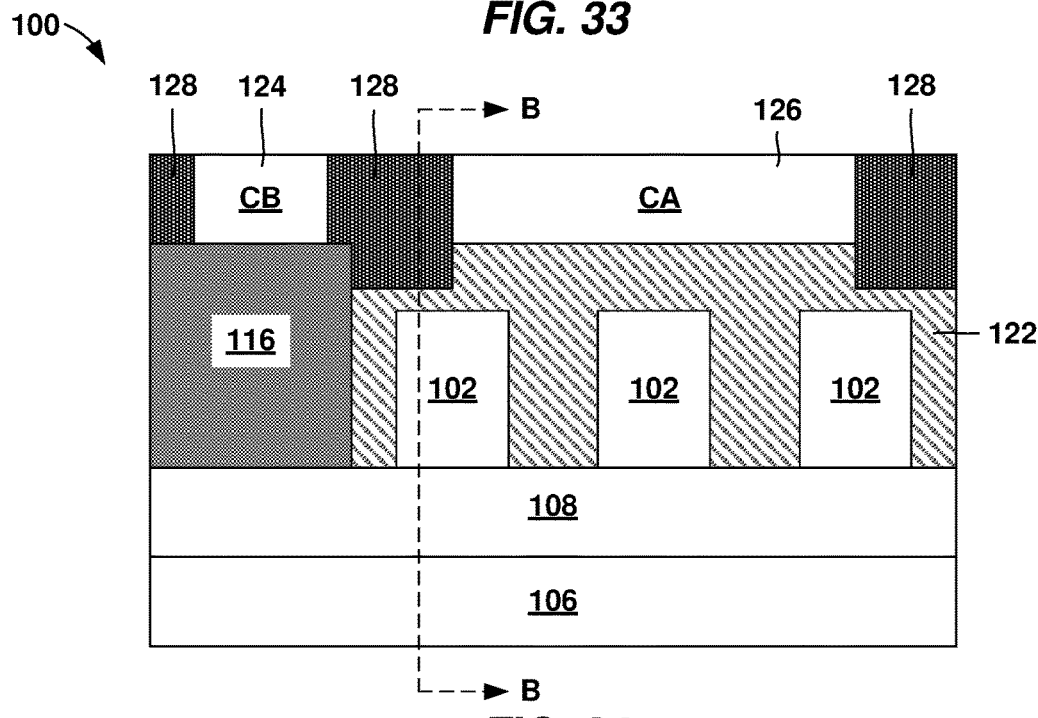
FIG. 34 is a cross section view of FIG. 33, taken along section line A-A according to an exemplary embodiment.

Referring now to FIGS. 32, 33, and 34, is shown after depositing an interlevel dielectric layer 128 (hereinafter "dielectric layer") and forming the gate contact 124, in accordance with an embodiment of the present invention. Like above, FIG. 32 is an isometric view of the structure 100; FIG. 33 is a cross section view of FIG. 34 taken along section line B-B, and perpendicular to the fins 102; and FIG. 34 is a cross section view of FIG. 33 taken along section line A-A, and parallel to the fins 102. As described above with reference to FIGS. 22, 23 and 24, the dielectric layer 128 may be deposited to electrically insulate the contacts from one another and prepare for subsequent processing. After depositing the dielectric layer 128, and in the present embodiment, the gate contact 124 is formed in the dielectric layer 128 using typical damascene or dual damascene techniques. For example, a via opening may be formed in the dielectric layer 128 and in the gate cap 120 in order to expose the gate electrode 118. Next, a larger contact opening or contact trench may be formed in the dielectric layer 128 stopping on or about the top of the gate cap 120. It should be noted that the via opening and the contact opening may be patterned in any order in accordance with typical dual damascene techniques. Finally, both the via opening and the contact opening may be substantially filled with a conductive material similar to those materials disclosed above with respect to the source drain contact 124. In some cases, a liner or diffusion barrier may be deposited within both the via opening and contact opening prior to depositing the final conductive material. Also, in most cases a chemical mechanical polishing technique is used to remove excess unwanted conductive material from upper surfaces of the structure 100.

Figure 35:
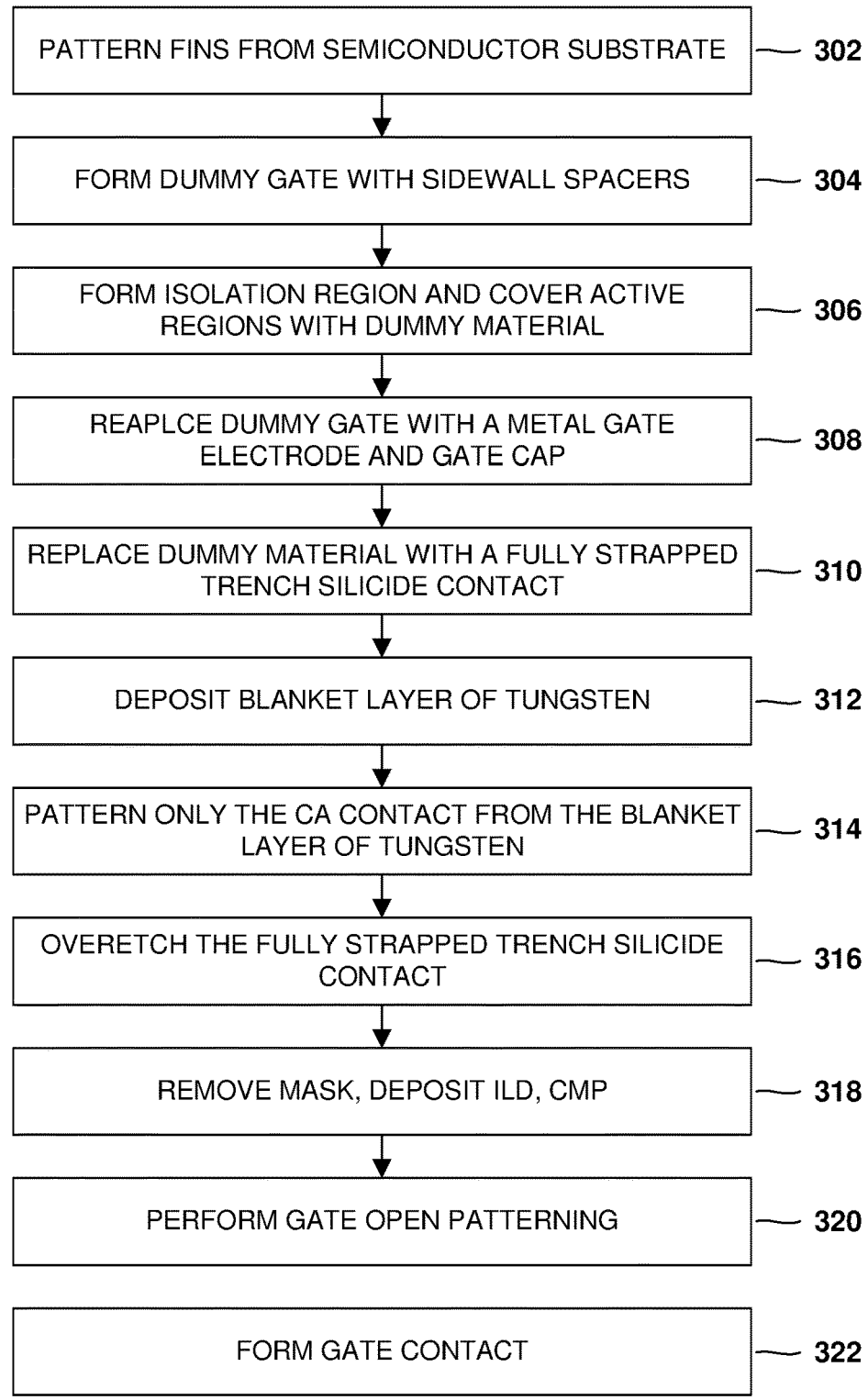
FIG. 35 is flowchart depicting operational steps of a process for fabricating a self-aligned contact with reduced contact-to-gate capacitance according to another exemplary embodiment.

Referring now to FIG. 35, a flowchart depicting the operational steps of recessing a portion of the strapped contact, as illustrated above with reference to FIGS. 26-34, is shown in accordance with an embodiment of the present invention. At an intermediate stage of a larger semiconductor manufacturing process, the process may begin with patterning semiconductor fins from a semiconductor substrate, at 302. Next, the process may include forming a dummy gate and sidewall spacers, for example, gate spacers, at 304. Next the process may continue with forming an isolation region and covering active regions with a dummy dielectric material, at 306. Next the process may include replacing the dummy gate with a metal gate electrode and gate cap, at 308. Next the process may continue with replacing the dummy dielectric material with a fully strapped trench silicide contact, at 310. Next the process may include depositing a blanket layer of tungsten, at 312. Next the process may continue with patterning only the CA contact from the blanket layer of tungsten, at 314. Next the process may include over etching the fully strapped self-aligned trench silicide contact prior to removing the photoresist or mask used to pattern the CA contact, at 316. Next the process may continue with removing the photoresist, depositing an inter-level dielectric material, and performing a chemical mechanical polishing technique, at 318. Next the process may include performing a gate open patterning by removing a portion of the ILD and a portion of the gate cap to expose the metal gate electrode, at 320. Finally, the process may conclude with forming a gate contact, at 322.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A finFET semiconductor device comprising:
   a plurality of fins etched from a semiconductor substrate;
   a gate electrode above and perpendicular to the plurality of fins, each comprising a pair of spacers on opposing sides of the gate electrode;
   a self-aligned silicide contact positioned above and between active fin regions, wherein the self-aligned silicide contact has a stepped profile comprising at least a first upper surface and a second upper surface, the first upper surface being above the second upper surface; and
   a metal contact above and in direct contact with the first upper surface of the self-aligned silicide contact, the self-aligned silicide contact provides an electrical path from the metal contact to the active fin regions.

2. The structure of claim 1, wherein the active fin regions are completely covered by the self-aligned silicide contact such that the second upper surface of the self-aligned silicide contact is above the active fin regions.

3. The structure of claim 1, wherein the first upper surface of the self-aligned silicide contact is substantially flush with an upper surface of a dielectric gate cap directly above the gate electrode.

4. The structure of claim 1, wherein a contact area between the metal contact and the self-aligned silicide contact is equal to a surface area of the first upper surface of the self-aligned silicide contact.

5. The structure of claim 1, wherein vertical sidewalls of the self-aligned silicide contact between the first upper surface and the second upper surface are substantially flush with vertical sidewalls of the metal contact.

6. The structure of claim 1, further comprising:
   an isolation region with an upper surface substantially flush with the first upper surface of the self-aligned silicide contact; and an interlevel dielectric layer covering the isolation region, the self-aligned silicide contact and the gate electrode, wherein a portion of the interlevel dielectric layer is below the upper surface of the isolation region and directly contacts a sidewall spacer separating the gate electrode from the self-aligned silicide contact.

7. A finFET semiconductor device comprising:
   a plurality of fins etched from a semiconductor substrate;
   a gate electrode above and perpendicular to the plurality of fins, each comprising a pair of spacers on opposing sides of the gate electrode;
   a self-aligned silicide contact positioned above and between active fin regions, wherein the self-aligned silicide contact has a stepped profile comprising at least a first upper surface and a second upper surface, the first upper surface being above the second upper surface; and
   a metal contact above and in direct contact with the first upper surface of the self-aligned silicide contact.

8. The structure of claim 7, wherein the active fin regions are completely covered by the self-aligned silicide contact such that the second upper surface of the self-aligned silicide contact is above the active fin regions.

9. The structure of claim 7, wherein the first upper surface of the self-aligned silicide contact is substantially flush with an upper surface of a dielectric gate cap directly above the gate electrode.

10. The structure of claim 7, wherein a contact area between the metal contact and the self-aligned silicide contact is equal to a surface area of the first upper surface of the self-aligned silicide contact.

11. The structure of claim 7, wherein vertical sidewalls of the self-aligned silicide contact between the first upper surface and the second upper surface are substantially flush with vertical sidewalls of the metal contact.

12. The structure of claim 7, further comprising:
    an isolation region with an upper surface substantially flush with the first upper surface of the self-aligned silicide contact; and an interlevel dielectric layer covering the isolation region, the self-aligned silicide contact and the gate electrode, wherein a portion of the interlevel dielectric layer is below the upper surface of the isolation region and directly contacts a sidewall spacer separating the gate electrode from the self-aligned silicide contact.

13. A finFET semiconductor device comprising:
    a plurality of fins etched from a semiconductor substrate;
    a gate electrode above and perpendicular to the plurality of fins, each comprising a pair of spacers on opposing sides of the gate electrode;
    a self-aligned silicide contact positioned above and between active fin regions, wherein the self-aligned silicide contact has a stepped profile comprising at least a first upper surface and a second upper surface, the first upper surface being above the second upper surface; and
    a metal contact on the first upper surface of the self-aligned silicide contact, the self-aligned silicide contact provides an electrical path from the metal contact to the active fin regions.

14. The structure of claim 13, wherein the active fin regions are completely covered by the self-aligned silicide contact such that the second upper surface of the self-aligned silicide contact is above the active fin regions.

15. The structure of claim 13, wherein the first upper surface of the self-aligned silicide contact is substantially flush with an upper surface of a dielectric gate cap directly above the gate electrode.

16. The structure of claim 13, wherein a contact area between the metal contact and the self-aligned silicide contact is equal to a surface area of the first upper surface of the self-aligned silicide contact.

17. The structure of claim 13, wherein vertical sidewalls of the self-aligned silicide contact between the first upper surface and the second upper surface are substantially flush with vertical sidewalls of the metal contact.

18. The structure of claim 13, further comprising:
an isolation region with an upper surface substantially flush with the first upper surface of the self-aligned silicide contact; and an interlevel dielectric layer covering the isolation region, the self-aligned silicide contact and the gate electrode, wherein a portion of the interlevel dielectric layer is below the upper surface of the isolation region and directly contacts a sidewall spacer separating the gate electrode from the self-aligned silicide contact.

* * * * *